United States Patent
Tang et al.

(10) Patent No.: US 10,504,599 B2
(45) Date of Patent: Dec. 10, 2019

(54) CONNECTING MEMORY CELLS TO A DATA LINE SEQUENTIALLY WHILE APPLYING A READ VOLTAGE TO THE MEMORY CELLS AND PROGRAMMING THE READ DATA TO A SINGLE MEMORY CELL

(71) Applicant: MICRON TECHNOLOGY, INC., Boise, ID (US)

(72) Inventors: Qiang Tang, Cupertino, CA (US); Ramin Ghodsi, San Jose, CA (US); Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/148,405

(22) Filed: Oct. 1, 2018

(65) Prior Publication Data
US 2019/0035472 A1    Jan. 31, 2019

Related U.S. Application Data

(62) Division of application No. 15/692,565, filed on Aug. 31, 2017, now Pat. No. 10,121,544, which is a
(Continued)

(51) Int. Cl.
*G11C 16/26* (2006.01)
*G11C 16/10* (2006.01)
(Continued)

(52) U.S. Cl.
CPC .......... *G11C 16/10* (2013.01); *G11C 11/5628* (2013.01); *G11C 16/0483* (2013.01);
(Continued)

(58) Field of Classification Search
CPC . G11C 16/10; G11C 11/5628; G11C 16/0483; G11C 16/08; G11C 16/26; G11C 16/3459; G11C 16/12; G11C 16/32
(Continued)

(56) References Cited

U.S. PATENT DOCUMENTS

| 6,028,788 A | 2/2000 | Choi et al. |
| 6,031,759 A | 2/2000 | Ohashi |

(Continued)

OTHER PUBLICATIONS

Shin,S.H., et al., "A New 3-bit Programming Algorithm using SLC-to-TLC Migration for 8MB/s High Performance TLC NAND Flash Memory", 2012 Symposium on VLSI Circuits Digest of Technical Papers, IEEE 2012, pp. 132-133.
(Continued)

*Primary Examiner* — Ly D Pham
(74) *Attorney, Agent, or Firm* — Dicke, Billig & Czaja, PLLC

(57) ABSTRACT

Programming methods include programming first and second data in first and second memory cells, reading the first data from the first memory cell by applying a read voltage to an access line connected to the first and second memory cells while the first memory cell is electrically connected to a data line and while the second memory cell is electrically disconnected from the data line, reading the second data from the second memory cell by electrically disconnecting the first memory cell from the data line and electrically connecting the second memory cell to the data line while the read voltage remains applied to the access line, and programming the read first data and the read second data in a single memory cell connected to a different access line.

20 Claims, 9 Drawing Sheets

Related U.S. Application Data division of application No. 15/191,786, filed on Jun. 24, 2016, now Pat. No. 9,779,819.

(51) Int. Cl.
| | | |
|---|---|---|
| *G11C 16/04* | (2006.01) | |
| *G11C 16/34* | (2006.01) | |
| *G11C 16/08* | (2006.01) | |
| *G11C 11/56* | (2006.01) | |
| *G11C 16/12* | (2006.01) | |
| *G11C 16/32* | (2006.01) | |

(52) U.S. Cl.
CPC .............. *G11C 16/08* (2013.01); *G11C 16/26* (2013.01); *G11C 16/3459* (2013.01); *G11C 16/12* (2013.01); *G11C 16/32* (2013.01)

(58) Field of Classification Search
USPC ..................................................... 365/185.12
See application file for complete search history.

(56) References Cited

U.S. PATENT DOCUMENTS

| | | |
|---|---|---|
| 6,903,981 B2 | 6/2005 | Futatsuyama et al. |
| 8,208,305 B2 | 6/2012 | Tanzawa |
| 2002/0118569 A1 | 8/2002 | Jeong et al. |
| 2006/0044872 A1 | 3/2006 | Nazarian |
| 2006/0250850 A1 | 11/2006 | Lee |
| 2008/0158950 A1 | 7/2008 | Aritome |
| 2008/0186776 A1 | 8/2008 | Kim et al. |
| 2008/0266968 A1 | 10/2008 | Mori |
| 2009/0287879 A1 | 11/2009 | Oh et al. |
| 2011/0019486 A1 | 1/2011 | Jang et al. |
| 2011/0211392 A1 | 9/2011 | Kim et al. |
| 2011/0305081 A1 | 12/2011 | Lee |
| 2012/0075940 A1 | 3/2012 | Toda |
| 2012/0250417 A1 | 10/2012 | La Rosa |
| 2013/0141971 A1 | 6/2013 | Hosono |
| 2013/0148430 A1 | 6/2013 | Shino et al. |
| 2013/0250700 A1 | 9/2013 | La Rosa |
| 2014/0068222 A1 | 3/2014 | Park et al. |
| 2014/0198583 A1 | 7/2014 | Kern et al. |
| 2015/0103596 A1 | 4/2015 | Dor et al. |
| 2015/0262693 A1 | 9/2015 | Kondo |
| 2015/0332769 A1 | 11/2015 | Kuo |
| 2016/0055914 A1 | 2/2016 | Nam et al. |
| 2016/0188210 A1 | 6/2016 | Tanzawa |

OTHER PUBLICATIONS

Hong, S., et al., "NAND Flash-based Disk Cache Using SLC/MLC Combined Flash Memory", 2010 International Workshop on Storage Network Architechture and Parallel I/O's, IEEE 2010, pp. 21-30.

CONNECTING MEMORY CELLS TO A DATA LINE SEQUENTIALLY WHILE APPLYING A READ VOLTAGE TO THE MEMORY CELLS AND PROGRAMMING THE READ DATA TO A SINGLE MEMORY CELL

RELATED APPLICATION

This Application is a Divisional of U.S. application Ser. No. 15/692,565, titled "CONNECTING MEMORY CELLS TO A DATA LINE SEQUENTIALLY WHILE APPLYING A PROGRAM VOLTAGE TO THE MEMORY CELLS," filed Aug. 31, 2017, which is a Divisional of U.S. application Ser. No. 15/191,786, titled "CONNECTING MEMORY CELLS TO A DATA LINE SEQUENTIALLY WHILE APPLYING A PROGRAM VOLTAGE TO THE MEMORY CELLS," filed Jun. 24, 2016, now U.S. Pat. No. 9,779,819, issued on Oct. 3, 2017 which are commonly assigned and incorporated herein by reference.

FIELD

The present disclosure relates generally to memory devices, and, in particular, the present disclosure relates to connecting memory cells to a data line sequentially while applying a program voltage to the memory cells.

BACKGROUND

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use one-transistor memory cells. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. For example, a row of memory cells might be those memory cells commonly connected to an access line. Columns of the array might include strings (often termed NAND strings) of memory cells connected together in series between a pair of select transistors, e.g., a source select transistor and a drain select transistor. Each source select transistor is connected to a source, while each drain select transistor is connected to a data line, such as bit line. For example, as used herein when elements are connected, they are electrically connected, e.g., by means of an electrically conductive path. As used herein, when elements are disconnected, for example, they are electrically disconnected (e.g., electrically isolated) from each other.

Programming operations (sometimes referred to as write operations) are generally used to assign a data state to a memory cell. Programming operations can be power-intensive and time consuming operations for a memory device.

DETAILED DESCRIPTION

Figure 1:
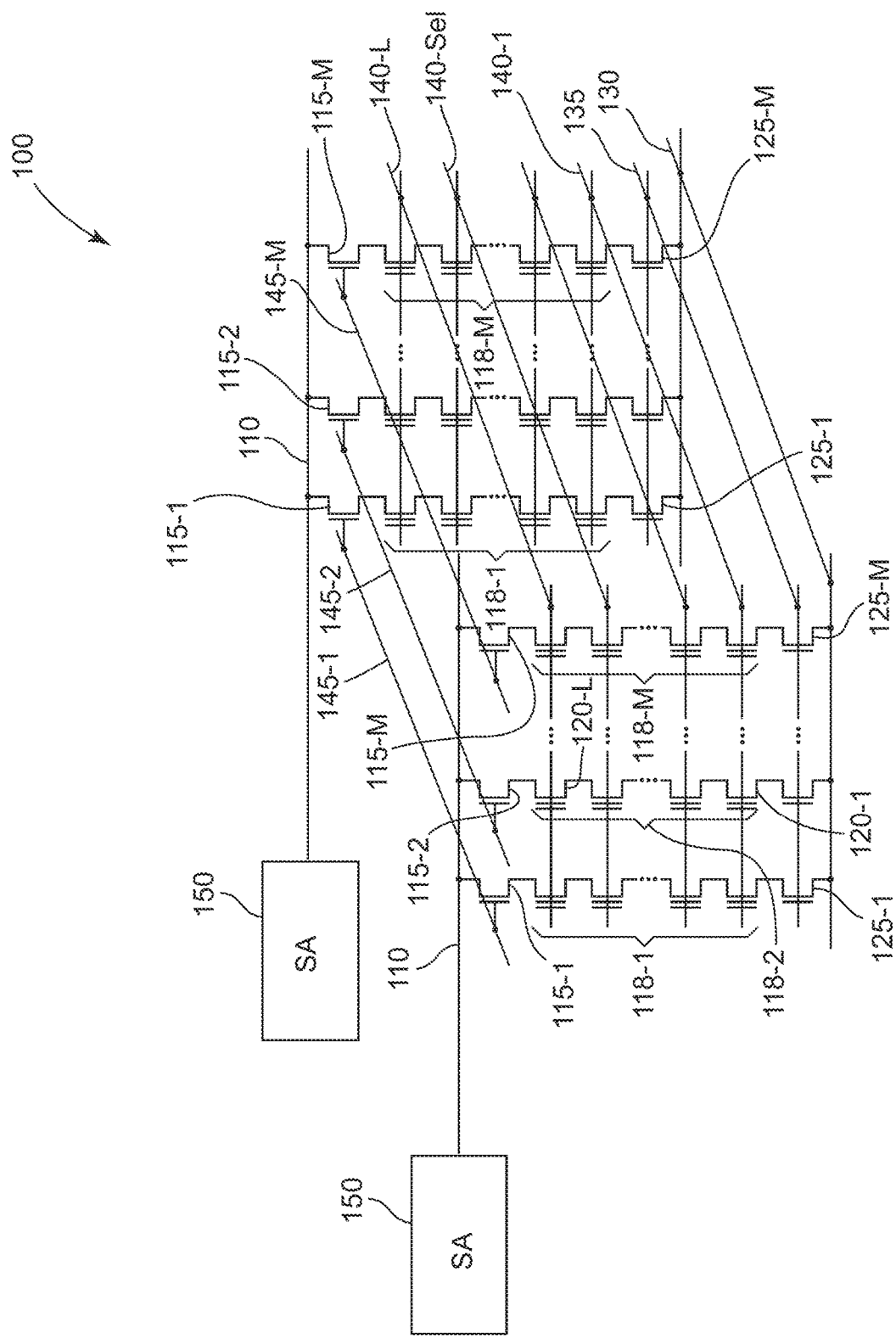
FIG. 1 is a schematic diagram of an example of a portion of a memory array.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 is a schematic diagram illustrating an example of a portion, such as a memory block 100, of a stacked memory array, such as a three-dimensional memory array. For example, memory block 100 may include a plurality of data lines 110, e.g., bit lines. A plurality of select transistors 115-1 to 115-M, e.g., drain-select transistors, may be connected to each of the plurality of data lines 110. Respective ones of strings 118-1 to 118-M of series-connected memory cells 120-1 to 120-L, such as non-volatile memory cells, may be respectively connected to respective ones of the select transistors 115-1 to 115-M connected to each of the plurality of data lines 110. For example, respective ones of strings 118-1 to 118-M may be respectively selectively electrically connected to each data line 110 by respective ones of the select transistors 115-1 to 115-M. Each of the strings 118-1 to 118-M, for example, might be a vertical string with a vertical stack of memory cells 120-1 to 120-L. It should be recognized the term vertical takes into account variations from "exactly" vertical due to routine manufacturing and/or assembly variations and that one of ordinary skill in the art would know what is meant by the term vertical.

Respective ones of select transistors 125-1 to 125-M, such as source-select transistors, may be respectively connected to the respective ones of the strings 118-1 to 118-M that may be selectively electrically connected to each of the plurality of data lines 110. The select transistors 125-1 to 125-M that may be respectively connected to the respective ones of the strings 118-1 to 118-M that may be selectively electrically connected to each of the plurality of data lines 110 may be commonly connected to a common source 130 and may be commonly connected by their respective control gates to a common select line 135, such as a common source-select line.

Control gates of respective ones of the memory cells 120-1 to 120-L in each of the strings 118-1 to 118-M that may be selectively electrically connected to each of the plurality of data lines 110 may be respectively connected to respective ones of common access lines 140-1 to 140-L. The select transistors 115-1 connected each of the plurality data lines 110 to the select transistors 115-M connected each of the plurality data lines 110 may be respectively connected to respective ones of select lines 145-1 to 145-M, such as drain-select lines. For example, control gates of the select transistors 115-1 connected each of the plurality data lines 110 may be commonly connected to select line 145-1; control gates of the select transistors 115-2 connected each of the plurality data lines 110 may be commonly connected to select line 145-2; . . . and control gates of the select transistors 115-M connected each of the plurality data lines 110 may be commonly connected to select line 145-M.

Signals on respective ones of select lines 145-1 to 145-M respectively control (e.g., activate and deactivate) the select transistor 115-1 connected each of the plurality data lines 110 to the select transistor 115-M connected each of the plurality data lines 110. For example, during sensing and/or programming operations, select transistors 115-1 to 115-M may be activated one at a time, e.g., respectively during respective ones of a plurality of different time periods. Note that activating a given one of select transistors 115-1 to 115-M may selectively electrically connect a respective one of the strings 118-1 to 118-M to a respective one of the plurality of data lines 110, for example.

A sense amplifier 150 might be connected to each of the plurality of data lines 110. For example, respective ones of a plurality of sense amplifiers 150 might be respectively connected to respective ones of the plurality of data lines 110.

Figure 2:
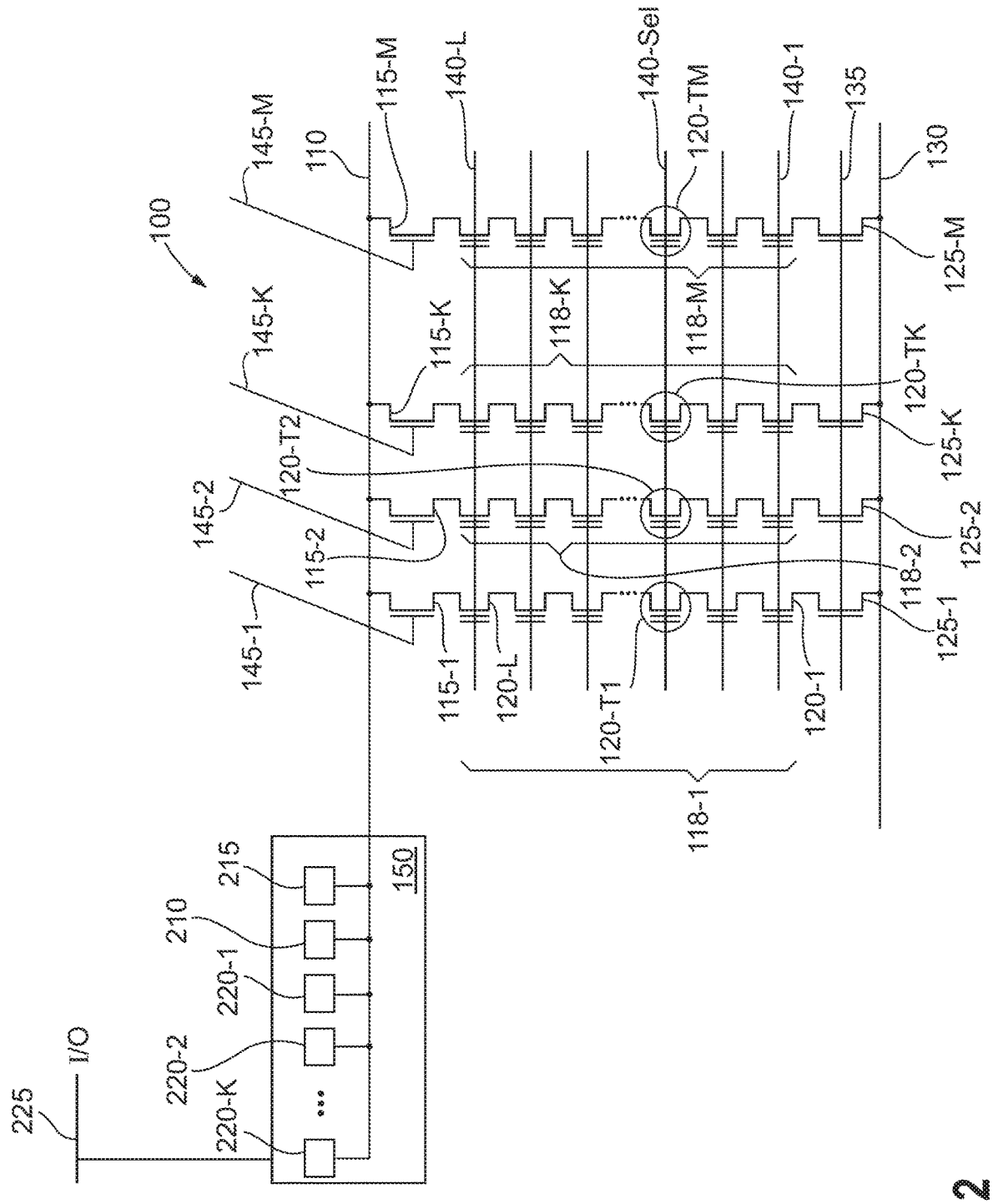
FIG. 2 includes a schematic diagram of an example of a portion of a memory array.

FIG. 2 includes a schematic diagram of a representative portion of the memory block 100 and a block diagram of a sense amplifier 150 connected to a data line 110. For example, a sense amplifier 150 might include sensing circuitry 210 that may be configured to sense current and/or voltage on the data line 110. Sense amplifier 150 might include circuitry 215 that may be configured to supply a voltage, such as a biasing voltage, to the data line 110. For example, circuitry 215 may be configured to charge the data line 110 to a certain voltage during a sensing operation or to apply program inhibit or program non-inhibit voltages to the data line 110.

A sense amplifier 150 might include a plurality of data registers, such as page buffers 220-1 to 220-K, e.g., K page buffers, for example. The page buffers 220-1 to 220-K may be connected to data line 110, for example. Each of the page buffers 220-1 to 220-K might be configured to temporarily store one bit of data, for example.

The memory cells 120 may be programmed to have a single bit of data, e.g., during single-level programming, or multiple bits of data, e.g., during multilevel programming. For example, memory cells 120 programmed to have a single bit may sometimes be referred to as single-level cells (e.g., SLCs), and memory cells 120 programmed to have multiple bits may sometimes be referred to as multilevel cells (e.g., MLCs).

A respective data value (e.g., as represented by a bit pattern) may be assigned to each of a plurality of levels, where each level corresponds to a respective data state. That is, for example, different bit patterns of N bits might be respectively assigned to different ones of $2^N$ program levels, where N might be an integer greater than or equal to one (1).

For single-level-cell (e.g., single-bit-per memory cell) programming, for example, N may be 1, and thus a single bit may be assigned to each of the two program levels, e.g., where each of the two program levels corresponds to a distinct range of threshold voltages (Vts). For example, a single-bit cell might be assigned a bit value of 1 when it is at its lowest program level, corresponding to a range of Vts, e.g. that might be an erased data state, and might be assigned a bit value of zero (0) when it is at its highest program level, corresponding to another range of Vts, e.g., that might be referred to as a programmed data state.

For multilevel, e.g., multi-bit-per memory cell, programming (e.g., N greater than 1), for example, each level (e.g., data state) may be characterized by a corresponding distinct range of threshold voltages (Vts) of a plurality of distinct ranges of threshold voltages that can be stored on the multilevel memory cells. A margin (e.g., a certain number of volts), such as a dead space, may separate adjacent threshold-voltage ranges, e.g., to facilitate differentiating between data values.

In some examples, the number page buffers K might be equal to the number of bits that may be stored in a single memory cell 120, e.g., when the memory cell 120 is configured to store a number of bits greater than one while operating in a multilevel (multi-bit-per-memory-cell) mode. For example, respective ones of the page buffers 220-1 to 220-K might respectively store one of the bits of a number of bits greater than one to be programmed to or to be read from a memory cell 120. That is, for example, the number of page buffers K might equal the N bits that may be stored in a single memory cell 120 when N is greater than one.

During a sensing operation, for example, the strings 118-1 to 118-M may be selected one at a time by respectively activating the select transistors 115-1 to 115-M one at a time to respectively electrically connect respective ones of the strings 118-1 to 118-M to a data line 110. For example, while a selected one of the strings 118-1 to 118-M is electrically connected to the data line 110 in FIG. 2, a sensing voltage, such as a read voltage or a program-verify voltage, may be applied to the selected access line 140-Sel in FIG. 2 of the access lines 140-1 to 140-L to sense a target memory cell, of the target memory cells 120-T1 to 120-TM, in the selected one of the strings 118-1 to 118-M.

For a read operation, when the sensed target memory cell stores K bits, respective ones of the K read bits may be respectively stored in respective ones of the page buffers 220-1 to 220-K, e.g., in the sense amplifier 150 connected to the data line 110. The read bits may then be output (e.g., latched) from the page buffers 220-1 to 220-K to an input/output bus 225 connected to page buffers 220-1 to 220-K; the sensing voltage removed from the selected access line 140-Sel; and the selected one of the strings 118-1 to 118-M may be electrically disconnected from the data line 110.

Subsequently, another selected one of the strings 118-1 to 118-M may be electrically connected to the data line 110 in FIG. 2, and a sensing voltage, such as a read voltage or a program-verify voltage, may again be applied to the selected access line 140-Sel in FIG. 2 of the access lines 140-1 to 140-L to sense a target memory cell, of the target memory cells 120-T1 to 120-TM, in the other selected one of the strings 118-1 to 118-M. When the sensed target memory cell in the other selected one of the strings 118-1 to 118-M stores K bits, respective ones of the K read bits may be respectively stored in respective ones of the page buffers 220-1 to 220-K, e.g., in the sense amplifier 150 connected to the data line 110.

In some examples, each of the strings 118-1 to 118-M selectively electrically connected to the bit line 110 in the example of FIG. 2, and thus the memory cells 120-1 to 120-L in each of those strings 118-1 to 118-M, may be configured to operate in a single-level (e.g., single-bit-per-memory-cell) mode. That is, for example, each of the memory cells 120-1 to 120-L in each the strings 118-1 to 118-M may be configured to store one bit.

During a read operation, one bit of data may be respectively read from respective ones of the target memory cells 120-T1 to 120-TK respectively in respective ones of strings 118-1 to 118-K of the strings 118-1 to 118-M. The respective ones of the bits read from the respective ones of the target memory cells 120-T1 to 120-TK, and thus from the respective ones of the strings 118-1 to 118-K, may be sent to respective ones of the page buffers 220-1 to 220-K.

For example, the strings of a group of K strings of the strings 118-1 to 118-M might be read one at time; respective ones of the K read bits of data may be sent (e.g., for temporary storage) respectively to respective ones of the K page buffers 220-1 to 220-K one at a time; and the K bits of data may be sent to input/output bus 225 from page buffers 220-1 to 220-K. This process of reading the strings of a group of K strings of the strings 118-1 to 118-M one at time, temporarily storing respective ones of K read bits of data one at a time respectively in respective ones of the K page buffers 220-1 to 220-K, and sending the K bits of data to input/output bus 225 might be repeated for other groups of K strings of the strings 118-1 to 118-M.

In the event the M strings 118-1 to 118-M are not divisible by K, e.g., there is a remaining group of strings of the strings 118-1 to 118-M with fewer than K strings, the strings of a group with fewer than K strings of the strings 118-1 to 118-M might be read one at time; respective ones of the fewer than K read bits of data may be sent (e.g., for temporary storage) respectively to respective ones of fewer than the K page buffers 220-1 to 220-K one at a time; and the fewer than K bits of data may be sent to input/output bus 225 from the fewer than the K page buffers 220-1 to 220-K.

Following is an example of sensing respective ones of K target memory cells 120-T1 to 120-TK (e.g., that each operate in a one-bit-per-memory-cell mode) respectively in respective ones of K strings 118-1 to 118-K one at a time, and is best discussed with reference to FIG. 2. This process may be repeated for other groups K target memory cells, where K other target memory cells are respectively in respective ones of K other strings of the strings 118-1 to 118-M and may be repeated for groups having fewer than K target memory cells.

A sensing operation on target memory cell 120-T1 may include concurrently applying a data-line voltage to data line 110 and a sense pass voltage to each of access lines 140-1 to 140-L. For example, the sense pass voltage may activate (e.g., turn on) the memory cells 120-1 to 120-L in each of the strings 118-1 to 118-L to place the memory cells 120-1 to 120-L in each of the strings 118-1 to 118-L in an electrically conducting mode. A common select-line-activation voltage may be applied to the common select line 135 to electrically connect strings 118-1 to 118-M to the common source 130, e.g., that might be at a source voltage, such as zero (0) volt, e.g., while data line 110 is at the data-line voltage and access lines 140-1 to 140-L are at the sense pass voltage.

As used herein, multiple acts being performed concurrently will mean that each of these acts is performed for a respective time period, and each of these respective time periods overlaps, in part or in whole, with each of the remaining respective time periods. In other words, those acts are concurrently performed for at least some period of time.

While data line 110 is at the data-line voltage and strings 118-1 to 118-M are electrically connected to the common source 130, the voltage applied to selected access line 140-Sel of access lines 140-1 to 140-L may be reduced to a sensing voltage (e.g., a read voltage or a program-verify voltage) while other (e.g., the remaining) access lines of access lines 140-1 to 140-L are kept at the sense pass voltage. That is, for example, data line 110, selected access line 140-Sel, the other access lines of access lines 140-1 to 140-L, common select line 135, and common source 130 might be respectively at the data-line voltage, the sensing voltage, the sense pass voltage, the common select-line-activation voltage, and source voltage concurrently.

While data line 110, selected access line 140-Sel, the other access lines of access lines 140-1 to 140-L, common select line 135, and common source 130 are respectively at the data-line voltage, the sensing voltage, the sense pass voltage, the common select-line-activation voltage, and source voltage concurrently and while select transistors 115-2 to 115-M are deactivated and strings 118-2 to 118-M are electrically disconnected from data line 110, for example, a select-line activation voltage might be applied to select line 145-1 to activate select transistor 115-1 to electrically connect string 118-1 to data line 110.

Note, for example, that a sensing portion of the sensing operation may be said to occur while the sense voltage is being applied to selected access line 140-Sel, select transistor 115-1 is activated, and target memory cell 120-T1 is being sensed. That is, for example, target memory cell 120-T1 may be sensed while data line 110, selected access line 140-Sel, the other access lines of access lines 140-1 to 140-L, common select line 135, common source 130, and select line 145-1 are respectively at the data-line voltage, the sensing voltage, the sense pass voltage, the common select-line-activation voltage, source voltage, and the select-line activation voltage concurrently.

During a read operation, when the sensing voltage is a read voltage, the single bit of data read from target memory cell 120-T1 may be sent to page buffer 220-1. During a program-verify operation, when the sensing voltage is a program-verify voltage, page buffer 220-1 might be used to store a bit indicating whether target memory cell 120-T1 is programmed to its desired data state, and thus whether target memory cell 120-T1 passed the program-verify operation.

When the sensing operation on target memory cell 120-T1 is completed and either a read bit is stored in page buffer 220-1 or a bit in page buffer 220-1 is set to indicate whether target memory cell 120-T1 passed a program-verify operation, for example, the sensing voltage may be removed from selected access line 140-Sel; the sense pass voltage may be removed from the other access lines of access lines 140-1 to 140-L; the data-line voltage may be removed from data line 110; and transistor 115-1 is deactivated to electrically disconnect string 118-1 from data line 110. That is, for example, access lines 140-1 to 140-L and data line 110 might be discharged, e.g., to about zero (0) volt. Transistors 125-1 to 125-M might also be deactivated to electrically disconnect strings 118-1 to 118-M from source 130.

A sensing operation on target memory cell 120-T2 may include concurrently reapplying a data-line voltage to data line 110 and reapplying the sense pass voltage to each of access lines 140-1 to 140-L. The common select-line-activation voltage may be reapplied to the common select line 135 to electrically reconnect strings 118-1 to 118-M to the common source 130 that might be at the source voltage, while data line 110 is at the data-line voltage and access lines 140-1 to 140-L are at the sense pass voltage.

While data line 110 is at the data-line voltage and strings 118-1 to 118-M are electrically connected to the common source 130, the voltage applied to selected access line 140-Sel of access lines 140-1 to 140-L may be reduced to the sensing voltage while other (e.g., the remaining) access lines of access lines 140-1 to 140-L are kept at the sense pass voltage. That is, for example, data line 110, selected access line 140-Sel, the other access lines of access lines 140-1 to 140-L, common select line 135, and common source 130 might be respectively at the data-line voltage, the sensing voltage, the sense pass voltage, the common select-line-activation voltage, and source voltage concurrently.

While data line 110, selected access line 140-Sel, the other access lines of access lines 140-1 to 140-L, common select line 135, and common source 130 are respectively at the data-line voltage, the sensing voltage, the sense pass voltage, the common select-line-activation voltage, and source voltage concurrently, a select-line-activation voltage might be applied to select line 145-2 to activate select transistor 115-2 to electrically connect string 118-2 to data line 110, while the remaining select transistors of select transistors 115-1 to 115-M other than activated select transistor 115-2 are deactivated and the remaining strings of strings 118-1 to 118-M other than string 118-2 are electrically disconnected from data line 110, for example.

During a read operation, when the sensing voltage is a read voltage, the single bit of data read from target memory cell 120-T2 may be sent to page buffer 220-2. During a program-verify operation, when the sensing voltage is a program-verify voltage, page buffer 220-2 might be used to store a bit indicating whether target memory cell 120-T2 is programmed, and thus whether target memory cell 120-T2 passed the program-verify operation.

When the sensing operation on target memory cell 120-T2 is completed and either a read bit is stored in page buffer 220-2 or a bit in page buffer 220-2 is set to indicate whether target memory cell 120-T2 passed a program-verify operation, for example, the sensing voltage may be removed from selected access line 140-Sel; the sense pass voltage may be removed from the other access lines of access lines 140-1 to 140-L; the data-line voltage may be removed from data line 110; and transistor 115-2 may be deactivated to electrically disconnect string 118-2 from data line 110. That is, for example, access lines 140-1 to 140-L and data line 110 might be discharged, e.g., to about zero (0) volt. Transistors 125-1 to 125-M might also be deactivated to electrically disconnect strings 118-1 to 118-M from source 130.

A sensing operation on target memory cell 120-TK may include concurrently reapplying a data-line voltage to data line 110 and reapplying the sense pass voltage to each of access lines 140-1 to 140-L. The common select-line-activation voltage may be reapplied to the common select line 135 to electrically reconnect strings 118-1 to 118-M to the common source 130 that might be at the source voltage while data line 110 is at the data-line voltage and access lines 140-1 to 140-L are at the sense pass voltage.

While data line 110 is at the data-line voltage and strings 118-1 to 118-M are electrically connected to the common source 130, the voltage applied to selected access line 140-Sel of access lines 140-1 to 140-L may be reduced to the sensing voltage while other (e.g., the remaining) access lines of access lines 140-1 to 140-L are kept at the sense pass voltage. That is, for example, data line 110, selected access line 140-Sel, the other access lines of access lines 140-1 to 140-L, common select line 135, and common source 130 might be respectively at the data-line voltage, the sensing voltage, the sense pass voltage, the common select-line-activation voltage, and source voltage concurrently.

While data line 110, selected access line 140-Sel, the other access lines of access lines 140-1 to 140-L, common select line 135, and common source 130 are respectively at the data-line voltage, the sensing voltage, the sense pass voltage, the common select-line-activation voltage, and source voltage concurrently, a select-line-activation voltage might be applied to select line 145-K to activate select transistor 115-K to electrically connect string 118-K to data line 110, while the remaining select transistors of select transistors 115-1 to 115-M other than activated select transistor 115-K are deactivated and the remaining strings of strings 118-1 to 118-M other than string 118-K are electrically disconnected from data line 110, for example.

During a read operation, when the sensing voltage is a read voltage, the single bit of data read from target memory cell 120-TK may be sent to page buffer 220-K. During a program-verify operation, when the sensing voltage is a program-verify voltage, page buffer 220-K might be used to store a bit indicating whether target memory cell 120-TK is programmed, and thus whether target memory cell 120-TK passed the program-verify operation.

When the sensing operation on target memory cell 120-TK is completed and either a read bit is stored in page buffer 220-K or a bit in page buffer 220-K is set to indicate whether target memory cell 120-TK passed a program-verify operation, for example, the sensing voltage may be removed from selected access line 140-Sel; the sense pass voltage may be removed from the other access lines of access lines 140-1 to 140-L; the data-line voltage may be removed from data line 110; and transistor 115-K may be deactivated to electrically disconnect string 118-2 from data line 110. That is, for example, access lines 140-1 to 140-L and data line 110 might be discharged, e.g., to about zero (0) volt. Transistors 125-1 to 125-M might also be deactivated to electrically disconnect strings 118-1 to 118-M from source 130.

When the sensing operation on target memory cell 120-TK is completed for a read operation the read bits in page buffers 220-1 to 220-K may be sent to input/output bus 225.

In the above-described sensing operation for single-bit memory cells, the removing and reapplying of the sense pass voltage and the sensing voltage after sensing each target memory cell, can increase power consumption and, during a read operation, can reduce the read throughput and, during a program verify, can reduce programming throughput.

During a programming operation, for example, the strings 118-1 to 118-M may be selected one at a time by respectively activating the select transistors 115-1 to 115-M one at a time to respectively electrically connect respective ones of the strings 118-1 to 118-M to a data line 110. For example, while a selected one of the strings 118-1 to 118-M is electrically connected to the data line 110 in FIG. 2, a program voltage may be applied to the selected access line 140-Sel in FIG. 2 of the access lines 140-1 to 140-L to program a target memory cell, of the target memory cells 120-T1 to 120-TM, in the selected one of the strings 118-1 to 118-M.

For example, to program the target memory cell in the selected one of the strings 118-1 to 118-M with K bits of data, the K bits may be sent from input/output bus 225 to page buffers 220-1 to 220-K. That is, for example, respective ones of the K bits might be respectively stored in respective ones of page buffers 220-1 to 220-K. The target memory cell may then be programmed to the level assigned to the K bits in page buffers 220-1 to 220-K by applying the program voltage to the selected access line 140-Sel. After the target memory cell is programmed, the program voltage may be removed from the selected access line 140-Sel, and the selected one of the strings 118-1 to 118-M may be electrically disconnected from the data line 110.

To program a target memory cell in another selected one of the strings 118-1 to 118-M with K bits, the K bits may be sent from input/output bus 225 to page buffers 220-1 to 220-K. The other selected one of the strings 118-1 to 118-M may be electrically connected to the data line 110 in FIG. 2, and a program voltage may again be applied to the selected access line 140-Sel in FIG. 2 of the access lines 140-1 to 140-L to program the target memory cell in the other selected one of the strings 118-1 to 118-M to the level assigned to the K bits in page buffers 220-1 to 220-K. After the target memory cell is programmed, the program voltage may be removed from the selected access line 140-Sel, and the other selected one of the strings 118-1 to 118-M may be electrically disconnected from the data line 110.

When the memory cells are operating as single-bit memory cells, one bit of data may be respectively programmed one at a time to respective ones of the target memory cells 120-T1 to 120-TK respectively in respective ones of strings 118-1 to 118-K of the strings 118-1 to 118-M. For example, respective ones of K bits respectively stored in respective ones of the page buffers 220-1 to 220-K might be respectively programmed one at a time to respective ones of the target memory cells 120-T1 to 120-TK.

For example, respective ones of the page buffers 220-1 to 220-K may respectively receive respective ones of K bits from input/output bus 225, and the target memory cells of a group of K target memory cells of the target memory cells 120-T1 to 120-TM might be programmed one at time respectively with the respective ones of the bits respectively in the respective ones of page buffers 220-1 to 220-K. This process of receiving respective ones of K bits respectively in respective ones of the page buffers 220-1 to 220-K and programming respective ones of a group of K target memory cells one at time respectively with respective ones of K bits respectively in respective ones of the page buffers 220-1 to 220-K might be repeated for other groups of K target memory cells of the target memory cells 120-T1 to 120-TM.

In the event the M target memory cells 120-T1 to 120-TM respectively in the strings 118-1 to 118-M is not divisible by K, e.g., there is a remaining group of target memory cells of the target memory cells 120-T1 to 120-TM with fewer than K target memory cells, the target memory cells of a group with fewer than K target memory cells of the target memory cells 120-T1 to 120-TM might be programmed one at time with respective ones of bits respectively from respective ones of fewer than the K page buffers 220-1 to 220-K.

Following is an example of programming respective ones of K target memory cells 120-T1 to 120-TK (e.g., that each operate in a one-bit-per-memory-cell mode) respectively in respective ones of K strings 118-1 to 118-K one at a time, and is best discussed with reference to FIG. 2. This process may be repeated for other groups of K target memory cells respectively in respective ones of K other strings of the strings 118-1 to 118-M and may be repeated for groups having fewer than K target memory cells.

Programming of target memory cells 120-T1 to 120-TK might commence, for example, with receiving one bit of data in each of page buffers 220-1 to 220-K, where respective ones of the bits of data respectively in the respective ones page buffers 220-1 to 220-K are to be respectively programmed to respective ones of target memory cells 120-T1 to 120-TK.

A programming operation on target memory cell 120-T1 may include keeping select transistors 125-1 to 125-M deactivated, and the strings 118-1 to 118-M electrically disconnected from source 130, during the programming operation. A high data-line voltage, such as a program-inhibit voltage, may be applied to data line 110. In some examples, a pre-charge voltage might be applied to each of access lines 140-1 to 140-L, e.g., concurrently with applying the high data-line voltage to data line 110. While data line 110 is either at the high data-line voltage or at a low data-line voltage, such as a non-program-inhibit voltage, the voltage on each of access lines 140-1 to 140-L might be increased from the pre-charge voltage to a program pass voltage. Then, the voltage applied to selected access line 140-Sel of access lines 140-1 to 140-L may be increased from the program pass voltage to a program voltage while other (e.g., the remaining) access lines of access lines 140-1 to 140-L are kept at the program pass voltage and while data line 110 is either at the high data-line voltage or at the low data-line voltage. A select-line-activation voltage might be applied to select line 145-1 to activate select transistor 115-1 to electrically connect string 118-1 to data line 110 while selected access line 140-Sel of access lines 140-1 to 140-L is at the program voltage, the other access lines of access lines 140-1 to 140-L are kept at the program pass voltage, and while data line 110 is either at the high data-line voltage or at the low data-line voltage.

For example, data line 110 might be kept at the high data-line voltage when a program-verify operation, such as described above, determines that target memory cell 120-T1 is programmed to the data value (e.g., the bit value) in page buffer 220-1 or that target memory cell 120-T1 is at an initial state, e.g., a lowest state, such as an erased state or a state after a healing operation or pre-programming operation has been applied after an erase, and page buffer 220-1 stores the data value corresponding to the initial state, e.g., while a target memory cell in a string 118-1 connected to another data line 110 of the plurality of data lines 110 in FIG. 1 is programmed. For example, data line 110 might be kept at the high data-line voltage when there is no need to change the threshold voltage of target memory cell 120-T1, e.g., when the threshold voltage of target memory cell 120-T1 is in the range of threshold voltages assigned to the data value in page buffer 220-1.

The voltage on data line 110 might be lowered from the high data-line voltage to the low data-line voltage when the threshold voltage of target memory cell 120-T1 needs to be changed to program the data value in page buffer 220-1, e.g., when the threshold voltage of target memory cell 120-T1 needs to be changed to reach the range of threshold voltages assigned to the data value in page buffer 220-1. For example, data line 110 might be at the low data-line voltage while select transistor 115-1 is activated and electrically connects string 118-1 to data line 110, selected access line 140-Sel of access lines 140-1 to 140-L is at the program voltage, and the other access lines of access lines 140-1 to 140-L are kept at the program pass voltage.

A program-verify operation may then be performed on target memory cell 120-T1 to determine whether target memory cell 120-T1 is programmed. If the program-verify operation determines that target memory cell 120-T1 is programmed to the data value in page buffer 220-1, e.g., to a threshold voltage corresponding to the threshold-voltage range assigned to the data value in page buffer 220-1, then programming is finished for target memory cell 120-T1. If the program-verify operation determines that target memory cell 120-T1 is not programmed to the data value in page buffer 220-1, then the program voltage may be increased until a program-verify operation determines that target memory cell 120-T1 is programmed to the data value in page buffer 220-1.

After programming target memory cell 120-T1 to the data value in page buffer 220-1, the program voltage may be removed from selected access line 140-Sel of access lines 140-1 to 140-L, e.g., may be discharged (e.g., to 0 volt); the program pass voltage may be removed from the other access lines of access lines 140-1 to 140-L, e.g., may be discharged (e.g., to 0 volt); and select transistor 115-1 may be deactivated to electrically disconnect string 118-1 from data line 110. The high data-line voltage might be removed from data line 110, e.g., may be discharged (e.g., to 0 volt) in the event that data line 110 was at the high data-line voltage when the selected access line 140-Sel was at the program voltage.

Target memory cell 120-T2 may then be programmed to the data value in page buffer 220-2. A programming operation on target memory cell 120-T2 may include keeping select transistors 125-1 to 125-M deactivated, and the strings 118-1 to 118-M electrically disconnected from source 130, during the programming operation. The high data-line voltage may be reapplied to data line 110. In some examples, the pre-charge voltage might be reapplied to each of access lines 140-1 to 140-L, e.g., concurrently with applying the high data-line voltage to data line 110. While data line 110 is either at the high data-line voltage or at the low data-line voltage, the voltage on each of access lines 140-1 to 140-L might be increased from the pre-charge voltage to the program pass voltage. For example, the program pass voltage might be reapplied to each of access lines 140-1 to 140-L. Then, the voltage applied to selected access line 140-Sel of access lines 140-1 to 140-L may be increased from the program pass voltage to the program voltage while other (e.g., the remaining) access lines of access lines 140-1 to 140-L are kept at the program pass voltage and while data line 110 is either at the high data-line voltage or at the low data-line voltage. For example, the program voltage might be reapplied to selected access line 140-Sel. A select-line-activation voltage might be applied to select line 145-2 to activate select transistor 115-2 to electrically connect string 118-2 to data line 110 while selected access line 140-Sel of access lines 140-1 to 140-L is at the program voltage, the other access lines of access lines 140-1 to 140-L are kept at the program pass voltage, and while data line 110 is either at the high data-line voltage or at the low data-line voltage.

For example, data line 110 might be kept at the high data-line voltage when a program-verify operation, such as described above, determines that target memory cell 120-T2 is programmed to the data value (e.g., the bit value) in page buffer 220-2 or that target memory cell 120-T2 is at an initial state, e.g., a lowest state, such as an erased state or a state after a healing operation or pre-programming operation has been applied after an erase, and page buffer 220-2 stores the data value corresponding to the initial state, e.g., while a target memory cell in a string 118-2 connected to another data line 110 of the plurality of data lines 110 in FIG. 1 is programmed. For example, data line 110 might be kept at the high data-line voltage when there is no need to change the threshold voltage of target memory cell 120-T2, e.g., when the threshold voltage of target memory cell 120-T2 is in the range of threshold voltages assigned to the data value in page buffer 220-2.

The voltage on data line 110 might be lowered from the high data-line voltage to the low data-line voltage when the threshold voltage of target memory cell 120-T2 needs to be changed to program the data value in page buffer 220-2, e.g., when the threshold voltage of target memory cell 120-T2 needs to be changed to reach the range of threshold voltages assigned to the data value in page buffer 220-2. For example, data line 110 might be at the low data-line voltage while select transistor 115-2 is activated and electrically connects string 118-2 to data line 110, selected access line 140-Sel of access lines 140-1 to 140-L is at the program voltage, and the other access lines of access lines 140-1 to 140-L are kept at the program pass voltage.

A program-verify operation may then be performed on target memory cell 120-T2 to determine whether target memory cell 120-T2 is programmed. If the program-verify operation determines that target memory cell 120-T2 is programmed to the data value in page buffer 220-2, e.g., to a threshold voltage corresponding to the threshold-voltage range assigned to the data value in page buffer 220-2, then programming is finished for target memory cell 120-T2. If the program-verify operation determines that target memory cell 120-T2 is not programmed to the data value in page buffer 220-2, then the program voltage may be increased until a program-verify operation determines that target memory cell 120-T2 is programmed to the data value in page buffer 220-2.

After programming target memory cell 120-T2 to the data value in page buffer 220-2, the program voltage may be removed from selected access line 140-Sel of access lines 140-1 to 140-L, e.g., may be discharged (e.g., to 0 volt); the program pass voltage may be removed from the other access lines of access lines 140-1 to 140-L, e.g., may be discharged (e.g., to 0 volt); and select transistor 115-2 may be deactivated to electrically disconnect string 118-2 from data line 110. The high data-line voltage might be removed from data line 110, e.g., may be discharged (e.g., to 0 volt), in the event that data line 110 was at the high data-line voltage when the selected access line 140-Sel was at the program voltage.

Target memory cell 120-TK may then be programmed to the data value in page buffer 220-K. A programming operation on target memory cell 120-TK may include keeping select transistors 125-1 to 125-M deactivated, and the strings 118-1 to 118-M electrically disconnected from source 130, during the programming operation. The high data-line voltage may be reapplied to data line 110. In some examples, the pre-charge voltage might be reapplied to each of access lines 140-1 to 140-L, e.g., concurrently with applying the high data-line voltage to data line 110. While data line 110 is either at the high data-line voltage or at the low data-line voltage, the voltage on each of access lines 140-1 to 140-L might be increased from the pre-charge voltage to the program pass voltage. For example, the program pass voltage may be reapplied to each of access lines 140-1 to 140-L. Then, the voltage applied to selected access line 140-Sel of access lines 140-1 to 140-L may be increased from the program pass voltage to the program voltage while other (e.g., the remaining) access lines of access lines 140-1 to 140-L are kept at the program pass voltage and while data line 110 is either at the high data-line voltage or at the low data-line voltage. For example, the program voltage may be reapplied to selected access line 140-Sel. A select-line-activation voltage might be applied to select line 145-K to activate select transistor 115-K to electrically connect string 118-K to data line 110 while selected access line 140-Sel of access lines 140-1 to 140-L is at the program voltage, the other access lines of access lines 140-1 to 140-L are kept at the program pass voltage, and while data line 110 is either at the high data-line voltage or at the low data-line voltage.

For example, data line 110 might be kept at the high data-line voltage when a program-verify operation, such as described above, determines that target memory cell 120-TK is programmed to the data value (e.g., the bit value) in page buffer 220-K or that target memory cell 120-TK is at an initial state, e.g., a lowest state, such as an erased state or a state after a healing operation or pre-programming operation has been applied after an erase, and page buffer 220-K stores the data value corresponding to the initial state, e.g., while a target memory cell in a string 118-K connected to another data line 110 of the plurality of data lines 110 in FIG. 1 is programmed. For example, data line 110 might be kept at the high data-line voltage when there is no need to change the threshold voltage of target memory cell 120-TK, e.g., when the threshold voltage of target memory cell 120-TK is in the range of threshold voltages assigned to the data value in page buffer 220-K.

The voltage on data line 110 might be lowered from the high data-line voltage to the low data-line voltage when the threshold voltage of target memory cell 120-TK needs to be changed to program the data value in page buffer 220-K, e.g., when the threshold voltage of target memory cell 120-TK needs to be changed to reach the range of threshold voltages assigned to the data value in page buffer 220-K. For example, data line 110 might be at the low data-line voltage while select transistor 115-K is activated and electrically connects string 118-K to data line 110, selected access line 140-Sel of access lines 140-1 to 140-L is at the program voltage, and the other access lines of access lines 140-1 to 140-L are kept at the program pass voltage.

A program-verify operation may then be performed on target memory cell 120-TK to determine whether target memory cell 120-TK is programmed. If the program-verify operation determines that target memory cell 120-TK is programmed to the data value in page buffer 220-K, e.g., to a threshold voltage corresponding to the threshold-voltage range assigned to the data value in page buffer 220-K, then programming is finished for target memory cell 120-TK. If the program-verify operation determines that target memory cell 120-TK is not programmed to the data value in page buffer 220-K, then the program voltage may be increased until a program-verify operation determines that target memory cell 120-TK is programmed to the data value in page buffer 220-K.

After programming target memory cell 120-TK to the data value in page buffer 220-K, the program voltage may be removed from selected access line 140-Sel of access lines 140-1 to 140-L, e.g., may be discharged (e.g., to 0 volt); the program pass voltage may be removed from the other access lines of access lines 140-1 to 140-L, e.g., may be discharged (e.g., to 0 volt); and select transistor 115-K may be deactivated to electrically disconnect string 118-K from data line 110. The high data-line voltage might be removed from data line 110, e.g., may be discharged (e.g., to 0 volt), in the event that data line 110 was at the high data-line voltage when the selected access line 140-Sel was at the program voltage.

In the above-described programming operation for single-bit memory cells, the removing and reapplying of the program voltage after programming each target memory cell can increase power consumption and reduce programming throughput.

Figure 3:
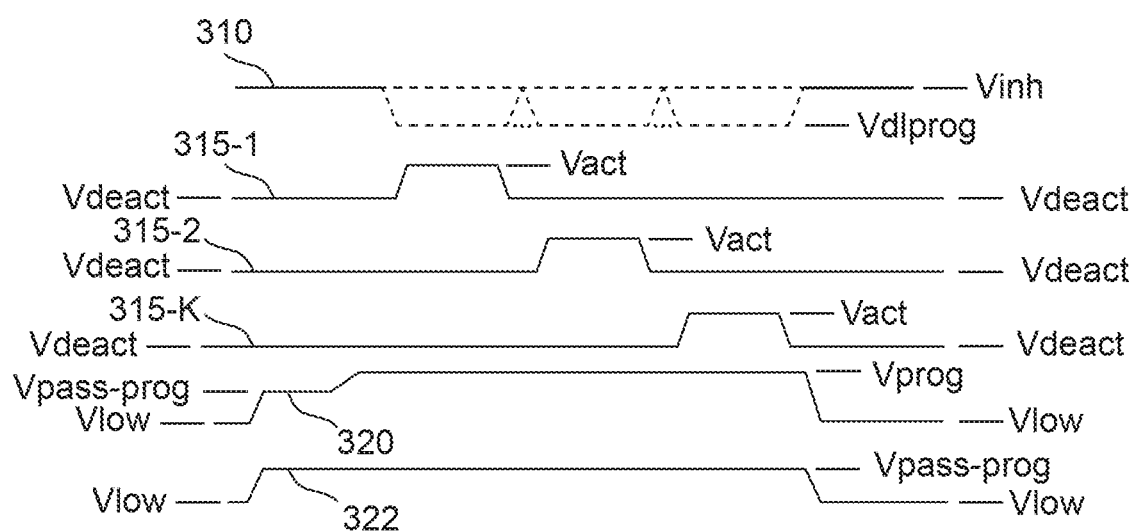
FIG. 3 presents a timing diagram for an example of a programming operation.

FIG. 3 is a timing diagram for an example of a programming operation, e.g., for programming target memory cells 120-T1 to 120-TK of the target memory cells 120-T1 to 120-TM sequentially (e.g., one at a time), e.g., during a single-bit-per-memory-cell mode of operation or during a multiple-bit-per-memory-cell-mode of operation when programming the multiple bits of a memory cell one bit at a time. Note for example, that the K target memory cells 120-T1 to 120-TK is a non-empty subset of the M target memory cells 120-T1 to 120-TM. The programming operation in the example of FIG. 3 might be applied during a single-level programming mode, for example, for programming target memory cells 120-T1 to 120-TK respectively in strings 118-1 to 118-K, e.g., as single-bit-per-memory-cell memory cells. Each of the target memory cells 120-T1 to 120-TK may be programmed to have a single bit of data, for example, when strings 118-1 to 118-K are operating in a single-bit-per-memory-cell mode. The K strings 118-1 to 118-K are a subset of the M strings 118-1 to 118-M, for example.

In some examples, select transistors 125-1 to 125-M might be deactivated by a deactivation voltage applied to common select line 135 so that strings 118-1 to 118-M might be electrically disconnected from common source 130 throughout the programming operation described in conjunction with FIG. 3. Common source 130 might be grounded during the programming operation, for example.

A voltage 310 may be applied to the data line 110 in FIG. 2. Voltages 315-1 to 315-K may be respectively applied to select lines 145-1 to 145-K of the select lines 145-1 to 145-M, and thus respectively to the control gates of select transistors 115-1 to 115-K that are respectively connected to select lines 145-1 to 145-K, in FIG. 2. A voltage 320 may be applied to selected access line 140-Sel of access lines 140-1 to 140-L, and thus concurrently to the control gates of the target memory cells 120-T1 to 120-TM in FIG. 2 that are commonly connected to selected access line 140-Sel.

A voltage 322 may be applied to unselected access lines (e.g., the remaining access lines other than selected access line 140-Sel) of access lines 140-1 to 140-L. That is, for example, voltage 322 may be applied to the control gates of untargeted memory cells (remaining cells other than target memory cell 120-T1) of the memory cells 120-1 to 120-L in string 118-1 that are respectively connected to unselected access lines of access lines 140-1 to 140-L, to the control gates of untargeted memory cells (remaining cells other than target memory cell 120-T2) of the memory cells 120-1 to 120-L in string 118-2 that are respectively connected to unselected access lines of access lines 140-1 to 140-L, to the control gates of untargeted memory cells (remaining cells other than target memory cell 120-TK) of the memory cells 120-1 to 120-L in string 118-K that are respectively connected to unselected access lines of access lines 140-1 to 140-L and to the control gates of untargeted memory cells (remaining cells other than target memory cell 120-TM) of the memory cells 120-1 to 120-L in string 118-M that are respectively connected to unselected access lines of access lines 140-1 to 140-L.

Note, for example, that applying the voltage 322 to a given one of the unselected access lines of access lines 140-1 to 140-L concurrently applies the voltage 322 to the control gates of the memory cells commonly electrically connected to the given one of the unselected access lines of access lines 140-1 to 140-L. For example, applying the voltage 322 to unselected access line 140-1 concurrently applies the voltage 322 to the control gates of the memory cells 120-1 commonly electrically connected to unselected access line 140-1, etc.

The programming operation may commence by loading each of page buffers 220-1 to 220-K with a data value (e.g., with one bit of data) received from input/output bus 225. For example, respective ones of the bits of data respectively loaded in page buffers 220-1 to 220-K may be respectively programmed into respective ones of the target memory cells 120-T1 to 120-TK.

The voltage 310 applied to data line 110 may be set at a high data-line voltage, such as a voltage Vinh, e.g., Vcc (e.g., 2 volts), that can inhibit the threshold voltages of target memory cells 120-T1 to 120-TK from being changed when target memory cells 120-T1 to 120-TK are electrically connected to data line 110. That is, for example, the voltage Vinh on data line 110 inhibits a target memory cell from programming when data line 110 is electrically connected to the string containing that target memory cell, and thus to the channel of that target memory cell. Vinh may be referred to as a program inhibit voltage.

The voltage 320 applied to selected access line 140-Sel and the voltage 322 applied to the unselected access lines may be increased concurrently to a voltage Vpass-prog (e.g., 10 volts) from a voltage Vlow, e.g., Vss (e.g., zero (0) volt), while the voltage 310 applied to data line 110 is at the voltage Vinh. The voltage 320 applied to selected access line 140-Sel may be subsequently increased to a program voltage (e.g., the access voltage for the programming operation), such as a voltage Vprog (e.g., 20 volts), from the voltage Vpass-prog while the voltage 322 applied to the unselected access lines remains at the voltage Vpass-prog and while the voltage 310 applied to data line 110 is at the voltage Vinh.

The voltage 315-1 applied to select line 145-1 may then be increased from a voltage Vdeact that deactivates select transistor 115-1 to a voltage Vact that activates select transistor 115-1 to electrically connect data line 110 to string 118-1, and thus to a channel of target memory cell 120-T1, while the voltage 322 applied to the unselected access lines remains at the voltage Vpass-prog and while the voltage 320 applied to selected access line 140-Sel is at the voltage Vprog. This may electrically connect the voltage 310 applied to data line 110, e.g., the voltage Vinh, to string 118-1, and thus to the channel of target memory cell 120-T1, while the voltage 322 applied to the unselected access lines remains at the voltage Vpass-prog and while the voltage 320 applied to selected access line 140-Sel is at the voltage Vprog.

The select transistors of select transistors 115-1 to 115-M other than select transistors 115-1 to 115-K respectively connected to strings of strings 118-1 to 118-M other than strings 118-1 to 118-K may remain deactivated during the programming of target memory cells 120-T1 to 120-TK so that the strings of strings 118-1 to 118-M other than strings 118-1 to 118-K may be electrically disconnected from data line 110 throughout the programming of target memory cells 120-T1 to 120-TK.

When the threshold voltage of target memory cell 120-T1 might not need to be changed to program the value of the bit of data in page buffer 220-1, the voltage 310 applied to data line 110 may remain at the voltage Vinh while select transistor 115-1 is activated. For example, the threshold voltage of target memory cell 120-T1 might not need to be changed when the value of the bit of data in page buffer 220-1 corresponds (e.g., is assigned) to an initial state, such as a lowest (e.g., an erased) state of target memory cell 120-T1. Alternatively, the threshold voltage of target memory cell 120-T1 might not need to be changed when a program-verify operation indicates that the threshold voltage of target memory cell 120-T1 was changed to a threshold voltage in a threshold-voltage range assigned to the bit value in page buffer 220-1 during a previous programming operation, e.g., when target memory cell 120-T1 passes the program-verify operation and the program-verify operation indicates that target memory cell 120-T1 was programmed to the bit value in page buffer 220-1 during the previous programming operation.

In some examples, a bit value of one (1) in a page buffer, such as page buffer 220-1, for a target memory cell, such as target memory cell 120-T1, might be assigned to the initial state. In some examples, when target memory cell 120-T1 has passed a program-verify operation, the bit value in page buffer 220-1 might be changed from the value (e.g., a zero (0)) to which target memory cell 120-T1 was programmed during a previous programming operation to a one. For example, the voltage 310 applied to data line 110 may remain at the voltage Vinh when the page buffer 220-1 stores a bit value of one.

When the threshold voltage of target memory cell 120-T1 might need to be changed (e.g., shifted) to program the value of the bit of data in page buffer 220-1, the voltage 310 applied to data line 110 might be decreased, e.g., concurrently with increasing the voltage 315-1 applied to select line 145-1 to Vact, and thus concurrently with activating select transistor 115-1, from the voltage Vinh to a low data-line voltage, such as a voltage Vdlprog (e.g., 0 volt), that may allow the threshold voltage of target memory cell 120-T1 to change in response to the voltage 320 applied to selected access line 140-sel, and thus to the control gate of target memory cell 120-T1, being at the voltage Vprog. That is, for example, the voltage 310 applied to data line 110 might be at the voltage Vdlprog while select transistor 115-1 is activated. Vdlprog may be referred to as a program enable voltage.

In some examples, a bit value of zero (0) in a page buffer, such as page buffer 220-1, for a target memory cell, such as target memory cell 120-T1, might be assigned to a state other than the initial state, e.g., to a threshold voltage range other than a threshold voltage range corresponding to the initial state. For example, a bit value of zero in page buffer 220-1 may indicate that the threshold voltage of target memory cell 120-T1 may need to be changed to reach the threshold voltage range assigned to the bit value of zero. That is, for example, the voltage 310 applied to data line 110 may be decreased to the voltage Vdlprog when the page buffer 220-1 stores a bit value of zero.

Note that the voltages 315-2 and 315-K respectively applied to select lines 145-2 and 145-K may be at the voltage Vdeact, and thus the select transistors 115-2 and 115-K respectively connected to select lines 145-2 and 145-K and respectively connected to strings 118-2 and 118-K may be deactivated, while select transistor 115-1 is activated. That is, for example, strings 118-2 and 118-K, and thus the channels of target memory cells 120-T2 and 120-TK, may be electrically disconnected from data line 110 while string 118-1, and thus the channel of target memory cell 120-T1, is electrically connected to data line 110.

After a certain time, the voltage 315-1 applied to select line 145-1 may then be decreased from the voltage Vact to the voltage Vdeact to deactivate select transistor 115-1 and to electrically disconnect data line 110 from string 118-1 while the voltage 322 applied to the unselected access lines remains at the voltage Vpass-prog without first being discharged and while the voltage 320 applied to selected access line 140-Sel remains at the voltage Vprog without first being discharged. After select transistor 115-1 is deactivated, the voltage applied to data line 110 may be either set to the voltage Vinh when the value of the bit of data in page buffer 220-2 corresponds to an initial state of target memory cell 120-T2 or set to the voltage Vdlprog when the value of the bit of data in page buffer 220-2 indicates that the threshold voltage of target memory cell 120-T2 might need to be changed to program the value of the bit of data in page buffer 220-2.

The voltage 315-2 applied to select line 145-2 may then be increased from the voltage Vdeact that deactivates select transistor 115-2 to the voltage Vact that activates select transistor 115-2 to electrically connect data line 110 to string 118-2, and thus to a channel of target memory cell 120-T2, while the voltage 322 applied to the unselected access lines remains at the voltage Vpass-prog without first being discharged, while the voltage 320 applied to selected access line 140-Sel remains at the voltage Vprog without first being discharged, while the voltage applied to data line 110 may be either set to the voltage Vinh or the voltage Vdlprog, and while the voltage 315-1 applied to select line 145-1 and the voltage 315-K applied to select line 145-K are at the voltage Vdeact, and thus select transistors 115-1 and 115-K are deactivated. This may electrically connect the voltage 310 applied to data line 110 to string 118-2, and thus to the channel of target memory cell 120-T2, while the voltage 322 applied to the unselected access lines remains at the voltage Vpass-prog and while the voltage 320 applied to selected access line 140-Sel remains at the voltage Vprog. For example, the select transistor 115-1 may be deactivated, and thus data line 110 may be electrically disconnected from string 118-1, and the select transistor 115-2 may be subsequently activated, and thus data line 110 may be subsequently electrically connected to string 118-2, while continuing to apply the program voltage Vprog to the selected access line 140-Sel without first discharging the program voltage Vprog and while continuing to apply the program-pass voltage Vpass-prog to the unselected access lines without first discharging the program-pass voltage Vpass-prog.

After a certain time, the voltage 315-2 applied to select line 145-2 may then be decreased from the voltage Vact to the voltage Vdeact to deactivate select transistor 115-2 and to electrically disconnect data line 110 from string 118-2, and thus from the channel of target memory cell 120-T2, while the voltage 322 applied to the unselected access lines remains at the voltage Vpass-prog without first being discharged and while the voltage 320 applied to selected access line 140-Sel remains at the voltage Vprog without first being discharged. After select transistor 115-2 is deactivated, the voltage applied to data line 110 may be either set to the voltage Vinh when the value of the bit of data in page buffer 220-K corresponds to an initial state of target memory cell 120-TK or set to the voltage Vdlprog when the value of the bit of data in page buffer 220-K indicates that the threshold voltage of target memory cell 120-TK might need to be changed to program the value of the bit of data in page buffer 220-K.

The voltage 315-K applied to select line 145-K may then be increased from the voltage Vdeact that deactivates select transistor 115-K to the voltage Vact that activates select transistor 115-K to electrically connect data line 110 to string 118-K, and thus to a channel of target memory cell 120-TK, while the voltage 322 applied to the unselected access lines remains at the voltage Vpass-prog without first being discharged, while the voltage 320 applied to selected access line 140-Sel remains at the voltage Vprog without first being discharged, while the voltage applied to data line 110 may be either set to the voltage Vinh or the voltage Vdlprog, and while the voltage 315-1 applied to select line 145-1 and the voltage 315-2 applied to select line 145-2 are at the voltage Vdeact, and thus select transistors 115-1 and 115-2 are deactivated. This may electrically connect the voltage 310 applied to data line 110 to string 118-K, and thus to the channel of target memory cell 120-TK, while the voltage 322 applied to the unselected access lines remains at the voltage Vpass-prog and while the voltage 320 applied to selected access line 140-Sel remains at the voltage Vprog. For example, the select transistor 115-2 may be deactivated, and thus data line 110 may be electrically disconnected from string 118-2, and the select transistor 115-K may be subsequently activated, and thus data line 110 may be subsequently electrically connected to string 118-K, while continuing to apply the program voltage Vprog to the selected access line 140-Sel without first discharging the program voltage Vprog and while continuing to apply the program-pass voltage Vpass-prog to the unselected access lines without first discharging the program-pass voltage Vpass-prog.

Note that during the programming of target memory cells 120-1 to 120-TK according to FIG. 3, the select transistors of the select transistors 115-1 to 115-M other than the select transistors 115-1 to 115-K are kept in their deactivated states so that the strings of the strings 118-1 to 118-M other than the strings 118-1 to 118-K that are respectively connected to the select transistors of the select transistors 115-1 to 115-M other than the select transistors 115-1 to 115-K are electrically disconnected from data line 110.

After a certain time, the voltage 315-K applied to select line 145-K may then be decreased from the voltage Vact to the voltage Vdeact to deactivate select transistor 115-K and to electrically disconnect data line 110 from string 118-K, and thus from the channel of target memory cell 120-TK. The voltage 322 applied to the unselected access lines may be discharged from the voltage Vpass-prog to the voltage Vlow, e.g., concurrently with decreasing the voltage 315-K applied to select line 145-K from the voltage Vact to the voltage Vdeact, and the voltage 320 applied to selected access line 140-Sel may be discharged from the voltage Vprog to the voltage Vlow, e.g., concurrently with decreasing the voltage 315-K applied to select line 145-K from the voltage Vact to the voltage Vdeac and concurrently with discharging the voltage 322 applied to the unselected access lines from the voltage Vpass-prog to the voltage Vlow. That is, for example, the program voltage Vprog may be removed from selected access line 140-Sel and the program pass voltage Vpass-prog may be removed the unselected access lines, e.g., while data line 110 is electrically disconnected from string 118-K.

After the program voltage Vprog is removed from selected access line 140-Sel and the program pass voltage Vpass-prog is removed the unselected access lines, a program-verify operation may be performed to determine whether target memory cells of target memory cells 120-T1 to 120-TK that might need to be programmed, e.g., from an initial state, have been programmed, e.g., from the initial state. That is, for example, a program-verify operation may be performed to determine whether the threshold voltage of those target memory cells of target memory cells 120-T1 to 120-TK whose threshold voltage is to be shifted has been shifted to the threshold voltage assigned to the value of the bit in the page buffers for those target memory cells of target memory cells 120-T1 to 120-TK whose threshold voltage is to be shifted. If any of those target memory cells of the target memory cells 120-T1 to 120-TK fails the program-verify operation, the programming operation in FIG. 3 might be repeated with an increased program voltage, e.g., Vprog may be increased by a step voltage.

For some examples, the program-verify operation may be performed to determine whether target memory cells of target memory cells 120-T1 to 120-TK are programmed to a bit value of zero. For example, the bit value in the page buffers for any target memory cells of target memory cells 120-T1 to 120-TK that are programmed to a bit value of zero may be changed to one for the repeated programming operation to indicate that these target memory cells will be inhibited during the repeated programming operation, and the bit value in the page buffers for any target memory cells of target memory cells 120-T1 to 120-TK that are not programmed to the bit value of zero may be left at zero for the repeated programming operation.

Note, for example, that in the examples described above in conjunction with FIG. 3 the strings 118-1 to 118-K may be electrically connected to data line sequentially (e.g., one at a time) while the program voltage Vprog remains on (e.g., is continually applied to) selected access line 140-Sel.

After the group of K target memory cells 120-T1 to 120-TK of the target memory cells 120-T1 to 120-TM are verified as being programmed, groups of K target memory cells of the target memory cells 120-T1 to 120-TM other than the group of K target memory cells 120-T1 to 120-TK may be programmed according FIG. 3. That is for example, other subsets of the target memory cells 120-T1 to 120-TM may be programmed according FIG. 3. In some examples, a group of n target memory cells of the target memory cells 120-T1 to 120-TM other than the group of K target memory cells 120-T1 to 120-TK may be programmed according FIG. 3, e.g., where n is less than K and greater than one. For example, the group of n target memory cells might remain to be programmed after programming the groups of K memory cells, e.g., when the number M of target memory cells 120-T1 to 120-TM is not divisible by K. That is, for example, other non-empty subsets of the M target memory cells 120-T1 to 120-TM that may include K or n target memory cells may be programmed according FIG. 3.

When the group of K target memory cells of the target memory cells 120-T1 to 120-TM other than the group of K target memory cells 120-T1 to 120-TK are to programmed, for example, the K values to be programmed may be sent to the page buffers 220-1 to 220-K that were previously used for the group of K target memory cells 120-T1 to 120-TK. When the group of n target memory cells of the target memory cells 120-T1 to 120-TM other than the group of K target memory cells 120-T1 to 120-TK are to be programmed, for example, the n values to be programmed may be sent to n of the page buffers 220-1 to 220-K that were previously used for the group of K target memory cells 120-T1 to 120-TK.

To program a group of K target memory cells of the target memory cells 120-T1 to 120-TM other than the group of K target memory cells 120-T1 to 120-TK, e.g., after verifying that target memory cells 120-T1 to 120-TK are programmed using a program-verify operation, the voltage 320 applied to selected access line 140-Sel and the voltage 322 applied to the unselected access lines might be concurrently increased to the voltage Vpass-prog, and then the voltage 320 applied to selected access line 140-Sel may be subsequently increased from the voltage Vpass-prog to the voltage Vprog. Respective ones of the group of K target memory cells of the target memory cells 120-T1 to 120-TM other than the group of K target memory cells 120-T1 to 120-TK may then be respectively programmed while respective ones of select transistors of the select transistors 115-1 to 115-M, for the group of K target memory cells of the target memory cells 120-T1 to 120-TM other than the group of K target memory cells 120-T1 to 120-TK, other than the select transistors 115-1 to 115-K for the group of K target memory cells 120-T1 to 120-TK are respectively activated while the voltage 320 applied to selected access line 140-Sel remains at Vprog without being discharged, the voltage 322 applied to the unselected access lines remains at Vpass-prog without being discharged, and the data line is either at Vdlprog or Vinh.

To program the group of n target memory cells of the target memory cells 120-T1 to 120-TM other than the group of K target memory cells 120-T1 to 120-TK, e.g., after verifying that target memory cells 120-T1 to 120-TK are programmed using a program-verify operation, the voltage 320 applied to selected access line 140-Sel and the voltage 322 applied to the unselected access lines might be concurrently increased to the voltage Vpass-prog, and then the voltage 320 applied to selected access line 140-Sel may be subsequently increased from the voltage Vpass-prog to the voltage Vprog. Respective ones of the group of n target memory cells of the target memory cells 120-T1 to 120-TM other than the group of K target memory cells 120-T1 to 120-TK may then be respectively programmed while respective ones of select transistors of the select transistors 115-1 to 115-M, for the group of n target memory cells of the target memory cells 120-T1 to 120-TM other than the group of K target memory cells 120-T1 to 120-TK, other than the select transistors 115-1 to 115-K for the group of K target memory cells 120-T1 to 120-TK are respectively activated while the voltage 320 applied to selected access line 140-Sel remains at Vprog without being discharged, the voltage 322 applied to the unselected access lines remains at Vpass-prog without being discharged, and the data line is either at Vdlprog or Vinh.

For examples, where only one target memory cell of the target memory cells 120-T1 to 120-TM, such as target memory cell 120-TM, remains to be programmed after one or more groups of K target memory cells of the target memory cells 120-T1 to 120-TM are programmed, e.g., when the number M of target memory cells 120-T1 to 120-TM is not divisible by K, the one remaining target memory cell might be programmed, e.g., as might be commonly done to program a single single-bit-per-memory-cell memory cell. For example, the one target memory cell may be a subset of the M target memory cells 120-T1 to 120-TM.

In some examples, a programming operation that programs target memory cell 120-TM as a single single-bit-per-memory-cell memory cell may commence by loading one of page buffers 220-1 to 220-K with a data value (e.g., with one bit of data) to be programmed to target memory cell 120-TM. The voltage 310 applied to data line 110 may be set to the voltage Vinh. The voltage 320 applied to selected access line 140-Sel and the voltage 322 applied to the unselected access lines may be increased concurrently to the voltage Vpass-prog from the voltage Vlow while the voltage 310 applied to data line 110 is at the voltage Vinh. The voltage 320 applied to selected access line 140-Sel may be subsequently increased to the voltage Vprog while the voltage 322 applied to the unselected access lines remains at the voltage Vpass-prog and while the voltage 310 applied to data line 110 is at the voltage Vinh.

A voltage applied to select line 145-M may then be increased from the voltage Vdeact that deactivates select transistor 115-M to the voltage Vact that activates select transistor 115-M to electrically connect data line 110 to string 118-M, and thus to a channel of target memory cell 120-TM, while the voltage 322 applied to the unselected access lines remains at the voltage Vpass-prog, while the voltage 320 applied to selected access line 140-Sel is at the voltage Vprog, and while the remaining select transistors of the select transistors 115-1 to 115-M other than select transistor 115-M are deactivated and the remaining strings of strings 118-1 to 118-M other than string 118-M are electrically disconnected from data line 110. This may electrically connect the voltage 310 applied to data line 110, e.g., the voltage Vinh, to string 118-M, and thus to the channel of target memory cell 120-TM, while the voltage 322 applied to the unselected access lines remains at the voltage Vpass-prog, while the voltage 320 applied to selected access line 140-Sel is at the voltage Vprog, and while the remaining strings of strings 118-1 to 118-M other than string 118-M are electrically disconnected from data line 110. For example, the remaining strings of strings 118-1 to 118-M other than string 118-M may be electrically disconnected from data line 110 throughout the programming of target memory cell 120-TM.

When the threshold voltage of target memory cell 120-TM might not need to be changed to program the value of the bit of data in the page buffer, the voltage 310 applied to data line 110 may remain at the voltage Vinh while select transistor 115-M is activated, while the voltage 322 applied to the unselected access lines remains at the voltage Vpass-prog, and while the voltage 320 applied to selected access line 140-Sel is at the voltage Vprog. When the threshold voltage of target memory cell 120-TM might need to be changed (e.g., shifted) to program the value of the bit of data in the page buffer, the voltage 310 applied to data line 110 might be decreased, e.g., concurrently with increasing the voltage applied to select line 145-M to the voltage Vact, and thus concurrently with activating select transistor 115-M, from the voltage Vinh to the voltage Vdlprog, while the voltage 322 applied to the unselected access lines remains at the voltage Vpass-prog, and while the voltage 320 applied to selected access line 140-Sel is at the voltage Vprog. That is, for example, the voltage 310 applied to data line 110 might be at the voltage Vdlprog while select transistor 115-M is activated.

Note that the select transistors of select transistors 115-1 to 115-M other than select transistor 115-M may be deactivated, while select transistor 115-M is activated. That is, for example, the strings of strings 118-1 to 118-M other than string 118-M may be electrically disconnected from data line 110 while string 118-M is electrically connected to data line 110. Strings 118-1 to 118-M might be electrically disconnected from source 130 while target memory cell 120-TM is being programmed, for example.

Figure 4:
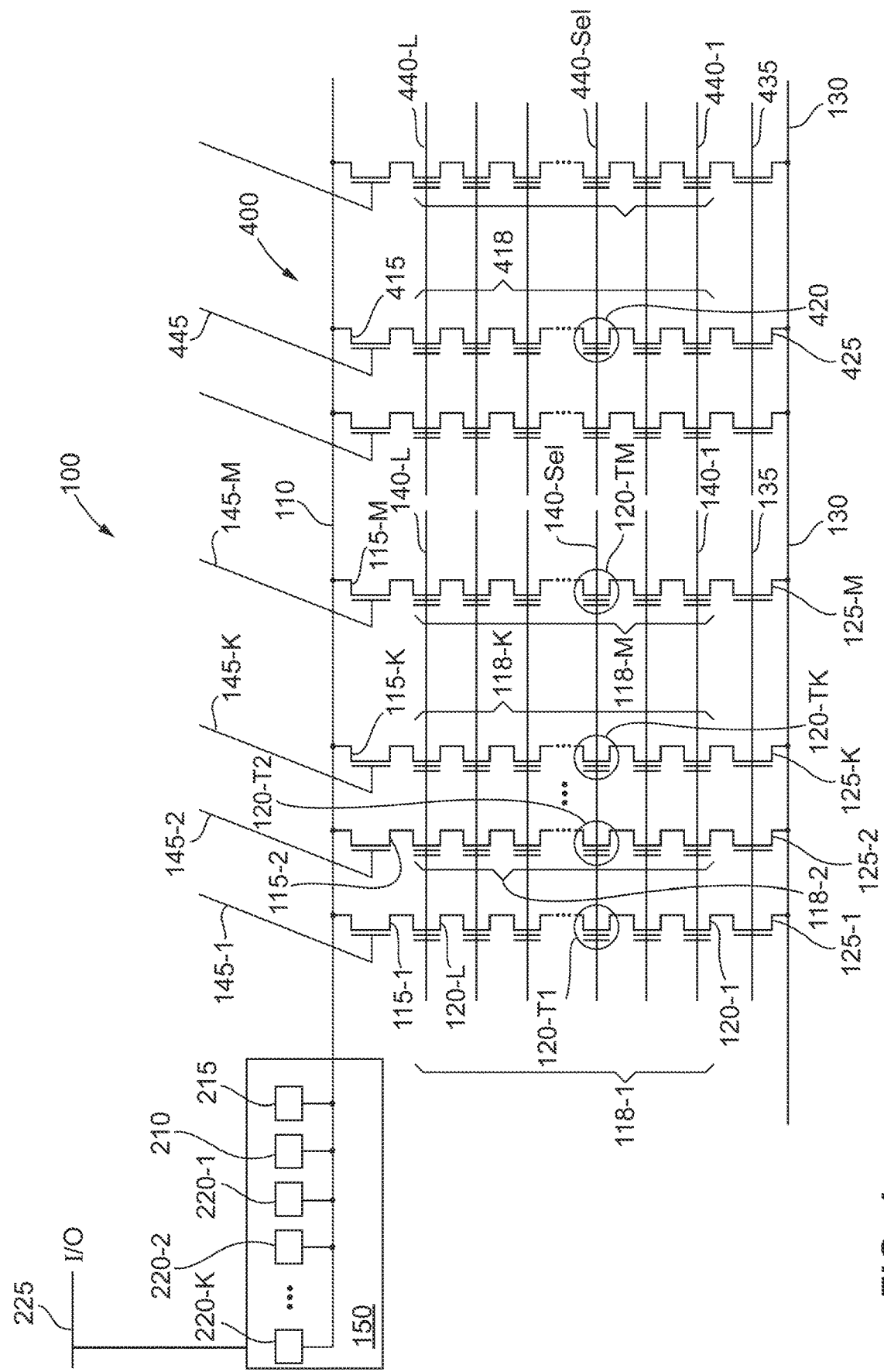
FIG. 4 includes a schematic diagram of another example of a portion of a memory array.

In the example of FIG. 4, the portion of the memory block 100 from FIG. 2 is shown connected to a portion of a memory block 400. For example, data line 110 might be common to the portions of memory blocks 100 and 400 in FIG. 4, and the source 130 might be common to the portions of memory blocks 100 and 400 in FIG. 4. Memory block 400 might be a stacked memory block, such as a three-dimensional memory block. For example, memory block 400 may have a structure similar to (e.g., the same as) the three-dimensional memory block 100 in FIG. 1. In some examples, memory blocks 100 and 400 might be portions of a three-dimensional memory array of a memory device, such as memory device 900 described below in conjunction with FIG. 9.

In some examples, memory block 100 might be selected to operate as an SLC memory block, e.g., in response to a command from a controller, such as controller 930 described below in conjunction with FIG. 9, connected to the memory device, and memory block 400 might be selected to operate as a KLC memory array, e.g., in response to a command from the controller. For example, the memory cells in memory block 100 might be selected to store one bit per memory cell, and thus memory block 100 might operate in a one-bit-per-memory-cell mode of operation, and the memory cells in memory block 400 might be selected to store K bits per memory cell, where K may be an integer greater than one, and thus memory block 400 might operate in a K-bit-per-memory-cell mode of operation. That is, for example, memory block 400 might operate in a multiple-bit-per-memory-cell mode of operation, and its memory cells might store multiple bits. For example, the memory cells in memory block 100 might be SLC (e.g., one-bit-per-memory-cell) memory cells, and the memory cells in memory block 400 might be MLC (e.g., multiple-bit-per-memory-cell) memory cells, such as KLC (e.g., K-bit-per-memory-cell) memory cells.

In some examples, the programming operation discussed above in conjunction with the example of FIG. 3 might be part of an overall programming operation that ultimately programs a target memory cell, such as target memory 420, in memory block 400, as a multibit-(e.g., a K-bit-) per-memory-cell memory cell. For example, the programming operation discussed above in conjunction with the example of FIG. 3 might be referred to as an SLC-(one-bit-per-memory-cell-) mode programming portion of the overall programming operation. For example, the overall programming operation might program respective ones of the K bits respectively programmed to the respective ones of target memory cells 120-T1 to 120-TK during the SLC-mode programming portion into target memory cell 420. For example, the SLC-mode programming portion in the example of FIG. 3 might be performed in the background, e.g., while other operations, such as reads or writes, are being performed, such as on other memory devices that might be connected to input/output bus 225.

In some examples, the overall programming operation might further include a read portion, such as an SLC-(one-bit-per-memory-cell-) mode read portion and a KLC-(K-bit-per-memory-cell-) mode programming portion. For example, the SLC-mode read portion might include reading respective ones of the K bits respectively programmed to the respective ones of target memory cells 120-T1 to 120-TK respectively from the respective ones of target memory cells 120-T1 to 120-TK. The respective ones of the bits read from target memory cells 120-T1 to 120-TK may then be respectively stored in respective ones of the page buffers 220-1 to 220-K, e.g., during the SLC-mode read portion. For example, the SLC-mode read portion might be performed in the background, e.g., while other operations, such as reads or writes, might be performed, such as on other memory devices that might be connected to input/output bus 225. In some examples, the SLC-mode read portion might be as described below in conjunction with FIG. 5.

The KLC-mode programming portion might include programming the target memory cell 420 with the K bits stored in page buffers 220-1 to 220-K and might be performed in the background, e.g., while other operations, such as reads or writes, might be performed, such as on other memory devices that might be connected to input/output bus 225. Select transistor 425 may be deactivated, and thus the string 418 of series-connected memory cells that includes target memory cell 420 may be electrically disconnected from source 130, during the programming operation on target memory cell 420. A high data-line voltage, such as the program-inhibit voltage Vinh in FIG. 3, may be applied to data line 110. In some examples, a pre-charge voltage might be applied to each of access lines 440-1 to 440-L, e.g., concurrently with applying the high data-line voltage to data line 110. While data line 110 is either at the high data-line voltage or at a low data-line voltage, such as the non-program-inhibit voltage Vdlprog in FIG. 3, the voltage on each of access lines 440-1 to 440-L might be increased from the pre-charge voltage to a program pass voltage, such as the voltage Vpass-prog in FIG. 3. Then, the voltage applied to selected access line 440-Sel of access lines 440-1 to 440-L may be increased from the program pass voltage to a program voltage while other (e.g., the remaining) access lines of access lines 440-1 to 440-L are kept at the program pass voltage and while data line 110 is either at the high data-line voltage or at the low data-line voltage.

For example, data line 110 might be at the high data-line voltage when the K bits of data are assigned to a threshold-voltage range corresponding to an initial threshold voltage of target memory cell 420, so that the threshold voltage of target memory cell 420 might not need to be changed. Data line 110 might be at the low data-line voltage when the K bits of data are assigned to a threshold-voltage range greater than the initial threshold voltage of target memory cell 420, meaning that the threshold voltage of target memory cell 420 might need to be increased to reach the threshold-voltage range to which the K bits of data are assigned.

A select-line-activation voltage might be applied to select line 445 to activate select transistor 415 to electrically connect string 418 to data line 110 while selected access line 440-Sel of access lines 440-1 to 440-L is at the program voltage, while the other, unselected access lines of access lines 440-1 to 440-L are kept at the program pass voltage, and while data line 110 is either at the high data-line voltage or at the low data-line voltage.

The voltage on data line 110 might be lowered from the high data-line voltage to the low data-line voltage when the threshold voltage of target memory cell 420 needs to be changed to program the K-bit data value in page buffers 220-1 to 220-K. For example, data line 110 might be at the low data-line voltage while select transistor 415 is activated and electrically connecting string 418 to data line 110, while selected access line 440-Sel of access lines 440-1 to 440-L is at the program voltage, and while the unselected access lines of access lines 440-1 to 440-L are kept at the program pass voltage.

A program-verify operation may then be performed on target memory cell 420 to determine whether target memory cell 420 is programmed. If the program-verify operation determines that target memory cell 420 is not programmed to the K-bit data value in page buffers 220-1 to 220-K, then the program voltage may be increased until a program-verify operation determines that target memory cell 420 is programmed to the K-bit data value in page buffers 220-1 to 220-K.

Figure 5:
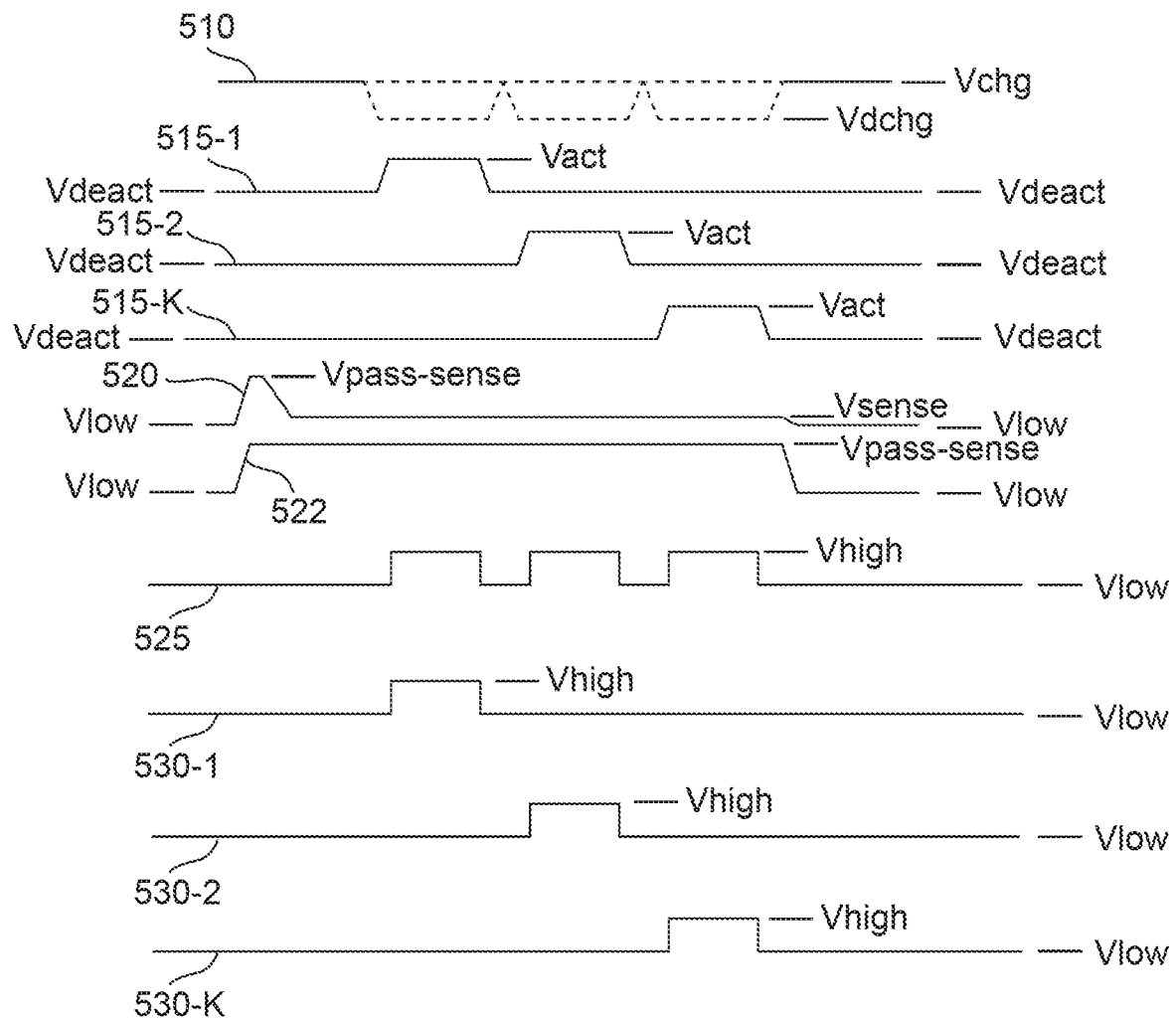
FIG. 5 presents a timing diagram for an example of a sensing operation.

FIG. 5 is a timing diagram of an example of a sensing operation, such as a read operation (e.g., that may be the SLC-mode read portion of the overall programming operation discussed above in conjunction with the example of FIG. 4) or a program-verify operation (e.g., that may be a program-verify for the programming operation discussed above in conjunction with the example of FIG. 3, and thus a program-verify for the SLC-mode programming portion of the overall programming operation discussed above in conjunction with the example of FIG. 4), e.g., to determine whether target memory cells 120-T1 to 120-TK are programmed. For example, the sensing operation in FIG. 5, might be used to sense target memory cells 120-T1 to 120-TK of the target memory cells 120-T1 to 120-TM in FIGS. 2 and 4 one at a time during a single-bit-per-memory-cell mode of operation.

In some examples, the sensing operation (e.g., a read or a program-verify operation) described in conjunction with the timing diagrams in FIG. 5 may be performed after the program voltage Vprog is removed from selected access line 140-Sel (FIG. 3) and the program pass voltage Vpass-prog is removed the unselected access lines (FIG. 3), e.g., after data line 110 is electrically disconnected from string 118-K.

A voltage 510 may be applied to data line 110 in FIG. 2 or FIG. 4. Voltages 515-1 to 515-K may be respectively applied to select lines 145-1 to 145-K of the select lines 145-1 to 145-M, and thus respectively to the control gates of select transistors 115-1 to 115-K that are respectively connected to select lines 145-1 to 145-K, in FIG. 2 or FIG. 4. A voltage 520 may be applied to the selected access line 140-Sel of access lines 140-1 to 140-L, and thus to the control gates of the target memory cells 120-T1 to 120-TM in FIG. 2 or FIG. 4 that are connected to the selected access line 140-Sel.

A voltage 522 may be applied to unselected access lines (e.g., the remaining access lines other than selected access line 140-Sel) of access lines 140-1 to 140-L. That is, for example, voltage 522 may be applied to the control gates of untargeted memory cells (remaining cells other than target memory cell 120-T1) of the memory cells 120-1 to 120-L in string 118-1 that are respectively connected to the unselected access lines of access lines 140-1 to 140-L, to the control gates of untargeted memory cells (remaining cells other than target memory cell 120-T2) of the memory cells 120-1 to 120-L in string 118-2 that are respectively connected to the unselected access lines of access lines 140-1 to 140-L, to the control gates of untargeted memory cells (remaining cells other than target memory cell 120-TK) of the memory cells 120-1 to 120-L in string 118-K that are respectively connected to the unselected access lines of access lines 140-1 to 140-L, . . . , and to the control gates of untargeted memory cells (remaining cells other than target memory cell 120-TM) of the memory cells 120-1 to 120-L in string 118-M that are respectively connected to the unselected access lines of access lines 140-1 to 140-L.

A voltage 525, such as a control voltage, might be applied to the sensing circuitry 210 of sense amplifier 150, and thus to sense amplifier 150. Voltages 530-1 to 530-K, such as control voltages, might be respectively applied to page buffers 220-1 to 220-K.

Throughout the sensing operation, select transistors 125-1 to 125-M might be activated by an activation voltage applied to common select line 135 to electrically connect strings 118-1 to 118-M to common source 130. In some examples, common source 130 might be grounded during the sensing operation.

The voltage 510 applied to data line 110 may be set at a voltage Vchg. While the voltage 510 is at the voltage Vchg, the voltage 520 applied to selected access line 140-Sel and the voltage 522 applied to the unselected access lines may be increased concurrently to a sense pass voltage Vpass-sense (e.g., 5 volt) from the voltage Vlow, e.g., Vss. The voltage Vpass-sense may be sufficient to activate (e.g., turn on) the memory cells to which it is applied. The voltage 520 applied to selected access line 140-Sel may be subsequently decreased to a sensing voltage Vsense, such as a read voltage (0.5 volt) or a program-verify voltage (e.g., 1 volt), from the voltage Vpass-sense while the voltage 522 applied to the unselected access lines remains at the voltage Vpass-sense and while the voltage 510 applied to data line 110 is at the voltage Vchg.

In some examples, after data line 110 is electrically disconnected from string 118-K, after the program voltage Vprog is removed from selected access line 140-Sel (FIG. 3), and after the program pass voltage Vpass-prog is removed the unselected access lines (FIG. 3), the sensing voltage Vsense (e.g., a read voltage or a program-verify voltage) may be applied to selected access line 140-Sel, and the voltage Vpass-sense may be applied to the unselected access lines.

To sense target memory cell 120-T1, the voltage 515-1 applied to select line 145-1 may then be increased from the voltage Vdeact that deactivates select transistor 115-1 to the voltage Vact that activates select transistor 115-1 to electrically connect data line 110 to string 118-1, and thus to target memory cell 120-T1, while the voltage 522 applied to the unselected access lines remains at the voltage Vpass-sense, while the voltage 520 applied to selected access line 140-Sel is at the voltage Vsense, and while select transistors 115-2 to 115-K are deactivated, and thus strings 118-2 to 118-K and target memory cells 120-T2 to 120-TK are electrically disconnected from data line 110.

Note that the voltage 522 being at the voltage Vpass-sense activates the unselected memory cells in string 118-1 so that target memory cell 120-T1 is electrically connected to source 130. Activating select transistor 115-1 may electrically connect the voltage 510 applied to data line 110, e.g., the voltage Vchg, to string 118-1, and thus to target memory cell 120-T1, while the voltage 522 applied to the unselected access lines remains at the voltage Vpass-sense and while the voltage 520 applied to selected access line 140-Sel is at the voltage Vsense.

The voltage 525 applied to the sensing circuitry 210 might be increased from the voltage Vlow to a voltage Vhigh, e.g., Vcc, concurrently with increasing the voltage 515-1 applied to select line 145-1 to the voltage Vact. The voltage Vhigh may cause (e.g., allow) the sensing circuitry 210 to sense a current and/or a voltage on data line 110 while select transistor 115-1 electrically connects string 118-1, and thus target memory cell 120-T1, to data line 110.

The voltage 530-1 applied to page buffer 220-1 might be increased from the voltage Vlow to the voltage Vhigh concurrently with increasing the voltage 515-1 applied to select line 145-1 to the voltage Vact and concurrently with increasing voltage 525 applied to the sensing circuitry 210 to the voltage Vhigh. Increasing the voltage 530-1 to the voltage Vhigh may cause page buffer 220-1 to store (e.g., latch) a data value (e.g., the value of the bit) stored in target memory cell 120-T1 and assigned to a voltage and/or current on data line 110.

When the voltage Vsense applied to the selected access line 140-Sel is insufficient to activate the target memory cell 120-T1, a current might not be able to flow through data line 110 and through the string 118-1 that includes target memory cell 120-T1, for example. As such, for example, sensing circuitry 210 might not sense a current on data line 110, and thus data line 110 may remain at the voltage Vchg. For example, sensing circuitry 210 might sense the voltage Vchg and/or no current on data line 110 when target memory cell 120-T1 remains deactivated in response to the voltage Vsense being applied to selected access line 140-Sel.

When the voltage Vsense applied to the selected access line 140-Sel is sufficient to activate the target memory cell 120-T1, current may flow through data line 110 and through the string 118-1 that includes target memory cell 120-T1, for example. As such, for example, sensing circuitry 210 might sense a current flow on data line 110. The current flow might cause the voltage 510 applied to data line 110 to decrease from the voltage Vchg to a voltage Vdchg while select transistor 115-1 is activated and select transistors 115-2 to 115-K are deactivated, the voltage 525 applied to sensing circuitry 210 is at the voltage Vhigh, the voltage 530-1 applied to page buffer 220-1 is at the voltage Vhigh, the voltages 530-2 to 530-K respectively applied to page buffers 220-2 to 220-K are at the voltage Vlow, the voltage 520 applied to selected access line 140-Sel is at the voltage Vsense, and the voltage 522 applied to the unselected access lines is at the voltage Vpass-sense. For example, sensing circuitry 210 might sense the voltage Vdchg and/or a current on data line 110 when target memory cell 120-T1 is activated in response to the voltage Vsense being applied to selected access line 140-Sel.

Sensing circuitry 210 not detecting a current flow and/or sensing circuitry 210 detecting the voltage Vchg may be indicative of the threshold voltage of target memory cell 120-T1 being greater than the voltage Vsense. For example, when the voltage Vsense applied to selected access line 140-Sel is a program-verify voltage during a program-verify operation, sensing circuitry 210 not detecting a current flow and/or sensing circuitry 210 detecting the voltage Vchg may be indicative of target memory cell 120-T1 being programmed to a desired data state, e.g., target memory cell 120-T1 passing the program-verify operation, and a data value in page buffer 220-1 might be changed, e.g., to a logical one (1), e.g., in response to the voltage 530-1 applied to page buffer 220-1 being at the voltage Vhigh, to indicate that target memory cell 120-T1 is programmed.

When the voltage Vsense applied to selected access line 140-Sel is a read voltage during a read operation, for example, sensing circuitry 210 not detecting a current flow and/or sensing circuitry 210 detecting the voltage Vchg may be indicative of target memory cell 120-T1 having a threshold voltage corresponding (e.g., assigned) to a particular data value, such as a logical 0, and thus may be indicative of target memory cell 120-T1 storing a logical 0. For example, the read operation may read the logical 0 stored in target memory cell 120-T1. For example, the logical 0 might be stored in page buffer 220-1, e.g., in response to the voltage 530-1 applied to page buffer 220-1 being at the voltage Vhigh.

Sensing circuitry 210 detecting a current flow and/or sensing circuitry 210 detecting the voltage Vdchg, may be indicative of the threshold voltage of target memory cell 120-T1 being less than the voltage Vsense applied to selected access line 140-Sel. For example, when the voltage Vsense is the program-verify voltage during the program-verify operation, sensing circuitry 210 detecting a current flow and/or sensing circuitry 210 detecting the voltage Vdchg may be indicative of target memory cell 120-T1 not being programmed to a desired data state, e.g., indicative of target memory cell 120-T1 failing the program-verify operation, and a data value in page buffer 220-1 might be left unchanged, e.g., at a logical zero (0), e.g., in response to the voltage 530-1 applied to page buffer 220-1 being at the voltage Vhigh, to indicate that target memory cell 120-T1 is not programmed. For example, logical 0 might indicate that an increased program voltage might need to be applied to target memory cell 120-T1.

When the voltage Vsense is a read voltage, for example, sensing circuitry 210 detecting a current flow and/or sensing circuitry 210 detecting the voltage Vdchg may be indicative of target memory cell 120-T1 having a threshold voltage corresponding to (e.g., assigned to) a different particular data value, such as a logical 1, and thus may be indicative of target memory cell 120-T1 storing a logical 1. For example, the read operation may read the logical 1 stored in target memory cell 120-T1. For example, the logical 1 might be stored in page buffer 220-1, e.g., in response to the voltage 530-1 applied to page buffer 220-1 being at the voltage Vhigh.

After sensing target memory cell 120-T1, while the voltage 520 applied to selected access line 140-Sel remains at the voltage Vsense without first being decreased (e.g., discharged) (e.g., while continuing to apply the voltage Vsense to selected access line 140-Sel without first discharging the voltage Vsense) and while the voltage 522 applied to the unselected access lines remains at the voltage Vpass-sense without first being decreased (e.g., discharged) (e.g., while continuing to apply the voltage Vpass-sense to the unselected access lines without first discharging the voltage Vpass-sense), the voltage 510 applied to data line 110 might be set to or left at the voltage Vchg, depending on whether the voltage 510 decreased to the voltage Vdchg while sensing target memory cell 120-T1; the voltage 515-1 applied to select transistor 115-1 might be decreased from the voltage Vact to Vdeact to deactivate select transistor 115-1 and to electrically disconnect data line 110 from string 118-1; the voltage 525 applied to sensing circuitry 210 might be decreased from the voltage Vhigh to the voltage Vlow; and the voltage 530-1 applied to page buffer 220-1 might be decreased from the voltage Vhigh to the voltage Vlow.

To sense target memory cell 120-T2, the voltage 515-2 applied to select line 145-2 may then be increased from the voltage Vdeact that deactivates select transistor 115-2 to the voltage Vact that activates select transistor 115-2 to electrically connect data line 110 to string 118-2, and thus to target memory cell 120-T2, while the voltage 522 applied to the unselected access lines remains at the voltage Vpass-sense without first being decreased, while the voltage 520 applied to selected access line 140-Sel remains at the voltage Vsense without first being decreased, and while select transistors 115-1 and 115-K are deactivated, and thus strings 118-1 and 118-K and target memory cells 120-T1 and 120-TK are electrically disconnected from data line 110. For example, the select transistor 115-1 may be deactivated, and thus data line 110 may be electrically disconnected from string 118-1, and the select transistor 115-2 may be subsequently activated, and thus data line 110 may be subsequently electrically connected to string 118-2, while continuing to apply the voltage Vsense to the selected access line 140-Sel without first discharging the voltage Vsense and while continuing to apply the voltage Vpass-sense to the unselected access lines without first discharging the voltage Vpass-sense.

Note that the voltage 522 being at the voltage Vpass-sense activates the unselected memory cells in string 118-2 so that target memory cell 120-T2 is electrically connected to source 130. Activating select transistor 115-2 may electrically connect the voltage 510 applied to data line 110, e.g., the voltage Vchg, to string 118-2, and thus to target memory cell 120-T2, while the voltage 522 applied to the unselected access lines remains at the voltage Vpass-sense and while the voltage 520 applied to selected access line 140-Sel remains at the voltage Vsense.

The voltage 525 applied to the sensing circuitry 210 might be increased from the voltage Vlow to the voltage Vhigh concurrently with increasing the voltage 515-2 to the voltage Vact. The voltage Vhigh may cause (e.g., allow) the sensing circuitry 210 to sense a current and/or a voltage on data line 110 while select transistor 115-2 electrically connects string 118-2, and thus target memory cell 120-T2, to data line 110.

The voltage 530-2 applied to page buffer 220-2 might be increased from the voltage Vlow to the voltage Vhigh concurrently with increasing the voltage 515-2 to the voltage Vact and concurrently with increasing voltage 525 to the voltage Vhigh. Increasing the voltage 530-2 to the voltage Vhigh may cause page buffer 220-2 to store (e.g., latch) a data value (e.g., the value of the bit) stored in target memory cell 120-T2 and assigned to a voltage and/or current on data line 110.

When the voltage Vsense applied to the selected access line 140-Sel is insufficient to activate the target memory cell 120-T2, a current might not be able to flow through data line 110 and through the string 118-2 that includes target memory cell 120-T2, for example. As such, for example, sensing circuitry 210 might not sense a current on data line 110, and thus data line 110 may remain at the voltage Vchg. For example, sensing circuitry 210 might sense the voltage Vchg and/or no current on data line 110 when target memory cell 120-T2 remains deactivated in response to the voltage Vsense being applied to selected access line 140-Sel.

When the voltage Vsense applied to the selected access line 140-Sel is sufficient to activate the target memory cell 120-T2, current may flow through data line 110 and through the string 118-2 that includes target memory cell 120-T2, for example. As such, for example, sensing circuitry 210 might sense a current flow on data line 110. The current flow might cause the voltage 510 applied to data line 110 to decrease from the voltage Vchg to the voltage Vdchg while select transistor 115-2 is activated and select transistors 115-1 and 115-K are deactivated, the voltage 525 applied to sensing circuitry 210 is at the voltage Vhigh, the voltage 530-2 applied to page buffer 220-2 is at the voltage Vhigh, the voltages 530-1 and 530-K respectively applied to page buffers 220-1 and 220-K are at the voltage Vlow, the voltage 520 applied to selected access line 140-Sel is at the voltage Vsense, and the voltage 522 applied to the unselected access lines is at the voltage Vpass-sense. For example, sensing circuitry 210 might sense the voltage Vdchg and/or a current on data line 110 when target memory cell 120-T2 is activated in response to the voltage Vsense being applied to selected access line 140-Sel.

When the voltage Vsense is a program-verify voltage during a program-verify operation, for example, sensing circuitry 210 not detecting a current flow and/or sensing circuitry 210 detecting the voltage Vchg may be indicative of target memory cell 120-T2 being programmed to a desired data state, e.g., target memory cell 120-T2 passing the program-verify operation, and a data value in page buffer 220-2 might be changed, e.g., to a logical one (1), e.g., in response to the voltage 530-2 being at the voltage Vhigh, to indicate that target memory cell 120-T2 is programmed.

When the voltage Vsense applied to selected access line 140-Sel is a read voltage during a read operation, for example, sensing circuitry 210 not detecting a current flow and/or sensing circuitry 210 detecting the voltage Vchg may be indicative of target memory cell 120-T2 having a threshold voltage corresponding (e.g., assigned) to a particular data value, such as a logical 0, and thus may be indicative of target memory cell 120-T2 storing a logical 0. For example, the read operation may read the logical 0 stored in target memory cell 120-T2. For example, the logical 0 might be stored in page buffer 220-2, e.g., in response to the voltage 530-2 applied to page buffer 220-2 being at the voltage Vhigh.

When the voltage Vsense is the program-verify voltage during the program-verify operation, for example, sensing circuitry 210 detecting a current flow and/or sensing circuitry 210 detecting the voltage Vdchg may be indicative of target memory cell 120-T2 not being programmed to a desired data state, e.g., indicative of target memory cell 120-T2 failing the program-verify operation, and a data value in page buffer 220-2 might be left unchanged, e.g., at a logical zero (0), e.g., in response to the voltage 530-2 applied to page buffer 220-2 being at the voltage Vhigh, to indicate that target memory cell 120-T2 is not programmed. For example, logical 0 might indicate that an increased program voltage might need to be applied to target memory cell 120-T2.

When the voltage Vsense is a read voltage, for example, sensing circuitry 210 detecting a current flow and/or sensing circuitry 210 detecting the voltage Vdchg may be indicative of target memory cell 120-T2 having a threshold voltage corresponding to (e.g., assigned to) a different particular data value, such as a logical 1, and thus may be indicative of target memory cell 120-T2 storing a logical 1. For example, the read operation may read the logical 1 stored in target memory cell 120-T2. For example, the logical 1 might be stored in page buffer 220-2, e.g., in response to the voltage 530-2 applied to page buffer 220-2 being at the voltage Vhigh.

After sensing target memory cell 120-T2, while the voltage 520 applied to selected access line 140-Sel remains at the voltage Vsense without first being decreased (e.g., discharged) (e.g., while continuing to apply the voltage Vsense to selected access line 140-Sel without first discharging the voltage Vsense) and while the voltage 522 applied to the unselected access lines remains at the voltage Vpass-sense without first being decreased (e.g., discharged) (e.g., while continuing to apply the voltage Vpass-sense to the unselected access lines without first discharging the voltage Vpass-sense), the voltage 510 applied to data line 110 might be set to or left at the voltage Vchg, depending on whether the voltage 510 decreased to Vdchg while sensing target memory cell 120-T2; the voltage 515-2 applied to select transistor 115-2 might be decreased from the voltage Vact to Vdeact to deactivate select transistor 115-2 and to electrically disconnect data line 110 from string 118-2; the voltage 525 applied to sensing circuitry 210 might be decreased from the voltage Vhigh to the voltage Vlow; and the voltage 530-2 applied to page buffer 220-2 might be decreased from the voltage Vhigh to the voltage Vlow.

To sense target memory cell 120-TK, the voltage 515-K applied to select line 145-K may then be increased from the voltage Vdeact that deactivates select transistor 115-K to the voltage Vact that activates select transistor 115-K to electrically connect data line 110 to string 118-K, and thus to target memory cell 120-TK, while the voltage 522 applied to the unselected access lines remains at the voltage Vpass-sense without first being decreased, while the voltage 520 applied to selected access line 140-Sel remains at the voltage Vsense without first being decreased, and while select transistors 115-1 and 115-2 are deactivated, and thus strings 118-1 and 118-2 and target memory cells 120-T1 and 120-T2 are electrically disconnected from data line 110. For example, the select transistor 115-2 may be deactivated, and thus data line 110 may be electrically disconnected from string 118-2, and the select transistor 115-K may be subsequently activated, and thus data line 110 may be subsequently electrically connected to string 118-K, while continuing to apply the voltage Vsense to the selected access line 140-Sel without first discharging the voltage Vsense and while continuing to apply the voltage Vpass-sense to the unselected access lines without first discharging the voltage Vpass-sense.

Note that the voltage 522 applied to the unselected access lines being at the voltage Vpass-sense activates the unselected memory cells in string 118-K so that target memory cell 120-TK is electrically connected to source 130. Activating select transistor 115-K may electrically connect the voltage 510 applied to data line 110, e.g., the voltage Vchg, to string 118-K, and thus to target memory cell 120-TK, while the voltage 522 applied to the unselected access lines remains at the voltage Vpass-sense and while the voltage 520 applied to selected access line 140-Sel remains at the voltage Vsense.

The voltage 525 applied to the sensing circuitry 210 might be increased from the voltage Vlow to the voltage Vhigh concurrently with increasing the voltage 515-K applied to select line 145-K to the voltage Vact. The voltage Vhigh may cause (e.g., allow) the sensing circuitry 210 to sense a current and/or a voltage on data line 110 while select transistor 115-K electrically connects string 118-K, and thus target memory cell 120-TK, to data line 110.

The voltage 530-K applied to page buffer 220-K might be increased from the voltage Vlow to the voltage Vhigh concurrently with increasing the voltage 515-K applied to select line 145-K to the voltage Vact and concurrently with increasing the voltage 525 applied to the sensing circuitry 210 to the voltage Vhigh. Increasing the voltage 530-K to the voltage Vhigh may cause page buffer 220-K to store (e.g., latch) a data value (e.g., the value of the bit) stored in target memory cell 120-TK and assigned to a voltage and/or current on data line 110.

When the voltage Vsense applied to the selected access line 140-Sel is insufficient to activate the target memory cell 120-TK, a current might not be able to flow through data line 110 and through the string 118-K that includes target memory cell 120-TK, for example. As such, for example, sensing circuitry 210 might not sense a current on data line 110, and thus data line 110 may remain at the voltage Vchg. For example, sensing circuitry 210 might sense the voltage Vchg and/or no current on data line 110 when target memory cell 120-TK remains deactivated in response to the voltage Vsense being applied to selected access line 140-Sel.

When the voltage Vsense applied to the selected access line 140-Sel is sufficient to activate the target memory cell 120-TK, current may flow through data line 110 and through the string 118-K that includes target memory cell 120-TK, for example. As such, for example, sensing circuitry 210 might sense a current flow on data line 110. The current flow might cause the voltage 510 applied to data line 110 to decrease from the voltage Vchg to the voltage Vdchg while select transistor 115-K is activated and select transistors 115-1 and 115-2 are deactivated, the voltage 525 applied to sensing circuitry 210 is at the voltage Vhigh, the voltage 530-K applied to page buffer 220-K is at the voltage Vhigh, the voltages 530-1 and 530-2 respectively applied to page buffers 220-1 and 220-2 are at the voltage Vlow, the voltage 520 applied to selected access line 140-Sel is at the voltage Vsense, and the voltage 522 applied to the unselected access lines is at the voltage Vpass-sense. For example, sensing circuitry 210 might sense the voltage Vdchg on data line 110 when target memory cell 120-TK is activated in response to the voltage Vsense being applied to selected access line 140-Sel.

When the voltage Vsense applied to selected access line 140-Sel is a program-verify voltage during a program-verify operation, for example, sensing circuitry 210 not detecting a current flow and/or sensing circuitry 210 detecting the voltage Vchg may be indicative of target memory cell 120-TK being programmed to a desired data state, e.g., target memory cell 120-TK passing the program-verify operation, and a data value in page buffer 220-2 might be changed, e.g., to a logical one (1), e.g., in response to the voltage 530-K applied to page buffer 220-K being at the voltage Vhigh, to indicate that target memory cell 120-TK is programmed.

When the voltage Vsense applied to selected access line 140-Sel is a read voltage during a read operation, for example, sensing circuitry 210 not detecting a current flow and/or sensing circuitry 210 detecting the voltage Vchg may be indicative of target memory cell 120-TK having a threshold voltage corresponding (e.g., assigned) to a particular data value, such as a logical 0, and thus may be indicative of target memory cell 120-TK storing a logical 0. For example, the read operation may read the logical 0 stored in target memory cell 120-TK. For example, the logical 0 might be stored in page buffer 220-K, e.g., in response to the voltage 530-K applied to page buffer 220-K being at the voltage Vhigh.

When the voltage Vsense is the program-verify voltage during the program-verify operation, for example, sensing circuitry 210 detecting a current flow and/or sensing circuitry 210 detecting the voltage Vdchg may be indicative of target memory cell 120-TK not being programmed to a desired data state, e.g., indicative of target memory cell 120-TK failing the program-verify operation, and a data value in page buffer 220-K might be left unchanged, e.g., at a logical zero (0), e.g., in response to the voltage 530-K applied to page buffer 220-K being at the voltage Vhigh, to indicate that target memory cell 120-TK is not programmed. For example, logical 0 might indicate that an increased program voltage might need to be applied to target memory cell 120-TK.

When the voltage Vsense is a read voltage, for example, sensing circuitry 210 detecting a current flow and/or sensing circuitry 210 detecting the voltage Vdchg may be indicative of target memory cell 120-TK having a threshold voltage corresponding to (e.g., assigned to) a different particular data value, such as a logical 1, and thus may be indicative of target memory cell 120-TK storing a logical 1. For example, the read operation may read the logical 1 stored in target memory cell 120-TK. For example, the logical 1 might be stored in page buffer 220-K, e.g., in response to the voltage 530-K applied to page buffer 220-K being at the voltage Vhigh.

After the group of K target memory cells 120-T1 to 120-TK of the target memory cells 120-T1 to 120-TM are sensed according to FIG. 5, for example, groups of K target memory cells of the target memory cells 120-T1 to 120-TM other than the group of K target memory cells 120-T1 to 120-TK may be sensed according FIG. 5. For example, when the sensing operation in the example of FIG. 5 is a program-verify operation, the sensing operation in FIG. 5 might be performed for a group of K target memory cells of the target memory cells 120-T1 to 120-TM other than the group of K memory cells 120-T1 to 120-TK after a programming operation, such as described above in conjunction with FIG. 3, is performed on the group of K target memory cells of the target memory cells 120-T1 to 120-TM other than the group of K target memory cells 120-T1 to 120-TK to determine whether the target memory cells of the group of K target memory cells of the target memory cells 120-T1 to 120-TM other than the group of K target memory cells 120-T1 to 120-TK are programmed.

In some examples, where the group of n target memory cells of the target memory cells 120-T1 to 120-TM other than the group of K target memory cells 120-T1 to 120-TK may be programmed according FIG. 3, e.g., where n is less than K and greater than one, the sensing operation in FIG. 5 might be performed (e.g., as a program-verify operation) for the group of n target memory cells after the programming operation is performed on the group of n target memory cells to determine whether the target memory cells of the group of n target memory cells are programmed.

When the sensing operation described above in conjunction with FIG. 5 is a read operation and after the group of K target memory cells 120-T1 to 120-TK are read and after the data values in page buffers 220-1 to 220-K are sent (e.g., latched) to input/output bus 225, groups of K target memory cells of the target memory cells 120-T1 to 120-TM other than the group of K target memory cells 120-T1 to 120-TK may be read according FIG. 5. In some examples, the group of n target memory cells of the target memory cells 120-T1 to 120-TM other than the group of K target memory cells 120-T1 to 120-TK may be read after the data values in page buffers 220-1 to 220-K are sent (e.g., latched) to input/output bus 225.

In some examples, after the group of K target memory cells 120-T1 to 120-TK of the target memory cells 120-T1 to 120-TM are sensed according to FIG. 5 and before a sensing operation is performed on a group of K or n target memory cells of the target memory cells 120-T1 to 120-TM other than the group of K target memory cells 120-T1 to 120-TK, the voltage 522 applied to the unselected access lines may be decreased from the voltage Vpass-sense to the voltage Vlow; the voltage 520 applied to selected access line 140-Sel may be decreased from the voltage Vsense to the voltage Vlow; the voltage 510 applied to data line 110 might be set to or left at the voltage Vchg, depending on whether the voltage 510 decreased to Vdchg while sensing target memory cell 120-TK; the voltage 515-K applied to select transistor 115-K might be decreased from the voltage Vact to Vdeact to deactivate select transistor 115-K and to electrically disconnect data line 110 from string 118-K; the voltage 525 applied to sensing circuitry 210 might be decreased from the voltage Vhigh to the voltage Vlow; and the voltage 530-K applied to page buffer 220-K might be decreased from the voltage Vhigh to the voltage Vlow. The sensing operation described above in conjunction with FIG. 5 may then be performed for the group of K or n target memory cells of the target memory cells 120-T1 to 120-TM other than the group of K target memory cells 120-T1 to 120-TK.

When the group of K target memory cells of the target memory cells 120-T1 to 120-TM other than the group of K target memory cells 120-T1 to 120-TK are read, for example, the K read values may be sent to the page buffers 220-1 to 220-K that were previously used for the group of K target memory cells 120-T1 to 120-TK. When the group of n target memory cells of the target memory cells 120-T1 to 120-TM other than the group of K target memory cells 120-T1 to 120-TK are read, for example, the n read values may be sent to n of the page buffers 220-1 to 220-K that were previously used for the group of K target memory cells 120-T1 to 120-TK.

For examples, where only one target memory cell of the target memory cells 120-T1 to 120-TM, such as target memory cell 120-TM, is sensed, e.g., during a program-verify operation while target memory cell 120-TM is being programmed as a single single-bit-per-memory-cell memory cell or target memory cell 120-TM remains to be read after one or more groups of K target memory cells of the target memory cells 120-T1 to 120-TM are read, target memory cell 120-TM might be sensed as might be commonly done to sense a single single-bit-per-memory-cell memory cell, for example.

In some examples, target memory cell 120-TM might be sensed by setting the voltage 510 applied to data line 110 to the voltage Vchg, as shown in FIG. 5, for example. While the voltage 510 is at the voltage Vchg, the voltage 520 applied to selected access line 140-Sel and the voltage 522 applied to the unselected access lines may be increased concurrently to the voltage Vpass-sense from the voltage Vlow, as shown in FIG. 5, for example. The voltage 520 applied to selected access line 140-Sel may be subsequently decreased to the voltage Vsense, where the voltage Vsense is a read voltage or a program-verify voltage, from the voltage Vpass-sense while the voltage 522 applied to the unselected access lines remains at the voltage Vpass-sense and while the voltage 510 applied to data line 110 is at the voltage Vchg, as shown in FIG. 5, for example.

To sense target memory cell 120-TM, a voltage applied to select line 145-M may then be increased from the voltage Vdeact to the voltage Vact to activate select transistor 115-M and to electrically connect data line 110 to string 118-M, and thus to target memory cell 120-TM, while the voltage 522 applied to the unselected access lines remains at the voltage Vpass-sense, while the voltage 520 applied to selected access line 140-Sel is at the voltage Vsense, and while the select transistors of select transistors 115-1 to 115-M other than select transistor 115-M are deactivated, and thus the strings 118-1 to 118-M other than string 118-M and the target memory cells 120-T1 to 120-TM other than target memory cell 120-TM are electrically disconnected from data line 110.

Note that the voltage 522 being at the voltage Vpass-sense activates the unselected memory cells in string 118-M so that target memory cell 120-TM is electrically connected to source 130, e.g., in that select transistors 125-1 to 125-M may be activated while target memory cell 120-TM is being sensed. Activating select transistor 115-M may electrically connect the voltage 510 applied to data line 110, e.g., the voltage Vchg, to string 118-M, and thus to target memory cell 120-TM, while the voltage 522 remains at the voltage Vpass-sense and while the voltage 520 is at the voltage Vsense.

The voltage 525 applied to the sensing circuitry 210 might be increased from a voltage Vlow to a voltage Vhigh concurrently with increasing the voltage applied to select line 145-M to the voltage Vact. The voltage Vhigh may cause the sensing circuitry 210 to sense a current and/or voltage on data line 110 while select transistor 115-M electrically connects string 118-M, and thus target memory cell 120-TM, to data line 110.

A voltage applied to one of the page buffers 220-1 to 220-K might be increased from a voltage Vlow to a voltage Vhigh concurrently with increasing the voltage applied to select line 145-M to the voltage Vact and concurrently with increasing the voltage 525 applied to the sensing circuitry 210 to the voltage Vhigh. Increasing the voltage applied one of the page buffers 220-1 to 220-K to the voltage Vhigh during a read operation may cause that page buffer to store (e.g., latch) a data value (e.g., the value of the bit) stored in target memory cell 120-TM and assigned to a voltage and/or current on data line 110.

When the voltage Vsense applied to the selected access line 140-Sel is insufficient to activate the target memory cell 120-TM, a current might not be able to flow through data line 110 and through the string 118-M that includes target memory cell 120-TM, for example. As such, for example, sensing circuitry 210 might not sense a current on data line 110, and thus data line 110 may remain at the voltage Vchg. For example, sensing circuitry 210 might sense the voltage Vchg on data line 110 when target memory cell 120-TM remains deactivated in response to the voltage Vsense being applied to selected access line 140-Sel.

When the voltage Vsense applied to the selected access line 140-Sel is sufficient to activate the target memory cell 120-TM, current may flow through data line 110 and through the string 118-M that includes target memory cell 120-TM, for example. As such, for example, sensing circuitry 210 might sense a current flow on data line 110. The current flow might cause the voltage applied to data line 110 to decrease from the voltage Vchg to the voltage Vdchg while select transistor 115-M is activated and the select transistors of the select transistors 115-1 to 115-M other than select transistor 115-M are deactivated, the voltage 525 applied to sensing circuitry 210 is at the voltage Vhigh, the voltage applied to the page buffer of the page buffers 220-1 to 220-K used to store the data read from target memory cell 120-TM is at the voltage Vhigh, voltages applied to the remaining page buffers of the page buffers 220-1 to 220-K other than the page buffer of the page buffers 220-1 to 220-K used to store the data read from target memory cell 120-TM are at the voltage Vlow, the voltage 520 applied to selected access line 140-Sel is at the voltage Vsense, and the voltage 522 applied to the unselected access lines is at the voltage Vpass-sense. For example, sensing circuitry 210 might sense the voltage Vdchg on data line 110 when target memory cell 120-TM is activated in response to the voltage Vsense being applied to selected access line 140-Sel.

In some examples of a read operation, e.g., when the sensing operation in the example of FIG. 5 is a read operation and Vsense is a read voltage, and while the group of K target memory cells 120-T1 to 120-TK are read and the data read from target memory cells 120-T1 to 120-TK stored in page buffers 220-1 to 220-K and while the data stored in page buffers 220-1 to 220-K are sent (e.g., latched) to input/output bus 225, the voltage 520 applied to selected access line 140-Sel may remain at the voltage Vsense without being first decreased (e.g., discharged), and the voltage 522 applied to the unselected access lines may remain at the voltage Vpass-sense without first being decreased (e.g., discharged). A group of K target memory cells of the target memory cells 120-T1 to 120-TM other than the group of K target memory cells 120-T1 to 120-TK may then be read while the voltage 520 applied to selected access line 140-Sel remains at the voltage Vsense without first being decreased (e.g., discharged) and while the voltage 522 applied to the unselected access lines remains at the voltage Vpass-sense without first being decreased (e.g., discharged). That is, for example, the read operation described above in conjunction with FIG. 5 may be performed for successive groups of K target memory cells of the target memory cells 120-T1 to 120-TM without the voltage 520 applied to selected access line 140-Sel being decreased from the voltage Vsense between the successive groups of K target memory cells, and without the voltage 522 applied to the unselected access lines being decreased from the voltage Vpass-sense between the successive groups of K target memory cells.

For each of the successive groups of K target memory cells, for example, respective ones of the K target memory cells of that successive group of K target memory cells may be respectively read while respective ones of K select transistors, of the select transistors 115-1 to 115-M, for that successive group of K target memory cells are respectively activated. Respective ones of the K page buffers 220-1 to 220-K may be used to respectively temporarily store respective ones of the K bits respectively read while respective ones of the K select transistors for that successive group of K target memory cells are respectively activated.

The voltage 520 applied to selected access line 140-Sel may remain at the voltage Vsense without being decreased (e.g., discharged), and the voltage 522 applied to the unselected access lines may remain at the voltage Vpass-sense without being decreased (e.g., discharged) until all of the target memory cells 120-T1 to 120-TM are read, e.g., K target memory cells at a time when the number M of target memory cells 120-T1 to 120-TM is divisible by K. When the number M is not divisible by K, for example, the voltage 520 applied to selected access line 140-Sel may remain at the voltage Vsense without being decreased (e.g., discharged), and the voltage 522 applied to the unselected access lines may remain at the voltage Vpass-sense without being decreased (e.g., discharged) until all the groups of K target memory cells and m remaining target memory cells, where m is less than K and greater than or equal to one, are read. The m read bits from the m remaining target memory cells may be respectively temporarily stored in m of the K page buffers 220-1 to 220-K, for example, while the select transistors, of the select transistors 115-1 to 115-M, for the m remaining target memory cells are respectively activated.

Figure 6:
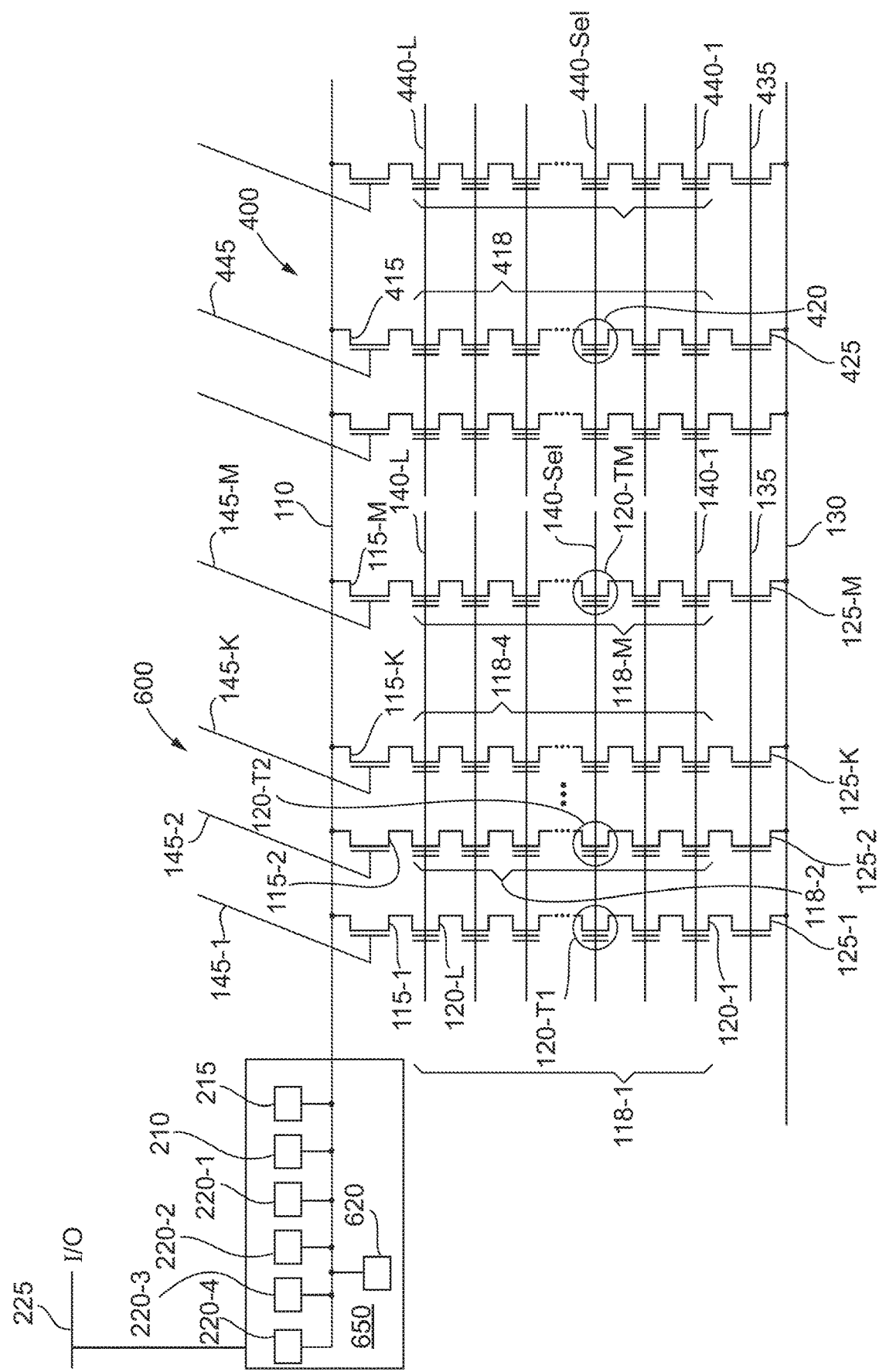
FIG. 6 includes a schematic diagram of another example of a portion of a memory array.

The example of FIG. 6 illustrates a portion of the memory block 400, e.g., as discussed above in conjunction with the example of FIG. 4, and a portion of a memory block 600. For example, memory block 400 might be a stacked memory block, such as a three-dimensional memory block, and might have a structure similar to (e.g., the same as) the three-dimensional memory block 100 in FIG. 1. Memory block 600 might have a structure similar to (e.g., the same as) the portion of memory block 100, e.g., as described above in conjunction with FIGS. 2 and 4.

Common numbering is used in FIGS. 2, 4, and 6 to denote similar (e.g., the same components) in FIGS. 2, 4, and 6, and, for example, those components may be as described above in conjunction with FIGS. 2 and 4. Note, however, that strings 118-1 to 118-4 in FIG. 6 may respectively be strings 118-1 to 118-K, e.g., as described above in conjunction with FIGS. 2 and 4, with K=4, for example.

Figure 9:
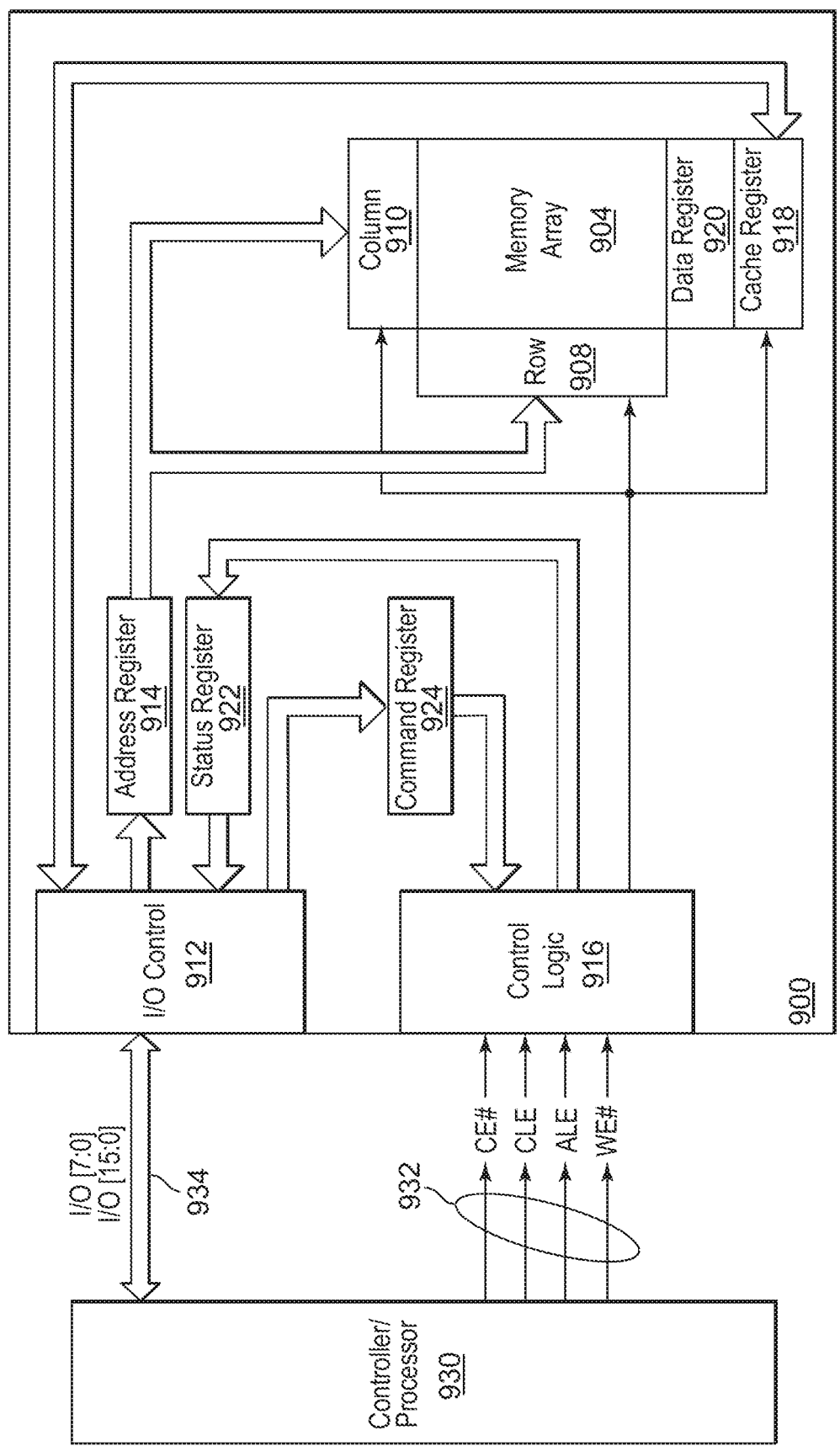
FIG. 9 is a simplified block diagram of an example of an electronic system.

In some examples, memory block 600 might be selected to operate as an ULC memory block, e.g., in response to a command from a controller, such as the controller 930 in FIG. 9, connected to a memory device, such as memory device 900 in FIG. 9, and memory block 400 might be selected to operate as an VLC memory block, e.g., in response to a command from the controller. For example, the memory cells in memory block 600 might be selected to store U (e.g., 2) bits per memory cell, and thus memory block 600 might operate in a U- (e.g., 2-) bit-per-memory-cell mode of operation, and the memory cells in memory block 400 might be selected to store V (e.g., 4) bits per memory cell, where U and V may be integers greater than one with V greater than U, and thus memory block 400 might operate in a V- (e.g., 4-) bit-per-memory-cell mode of operation. That is, for example, memory block 400 might operate in a V- (e.g., 4-) bit-per-memory-cell mode of operation, and its memory cells might store V (e.g., 4) bits, and memory block 600 might operate in a U- (e.g., 2-) bit-per-memory-cell mode of operation, and its memory cells might store U (e.g., 2) bits. For example, the memory cells in memory block 600 might be ULC (e.g., U- (e.g., 2-) bit-per-memory-cell) memory cells, and the memory cells in memory block 400 might be VLC (e.g., V- (e.g., 4-) bit-per-memory-cell) memory cells.

In some examples, an overall programming operation might program target memory cell 420 in memory block 400 to V (e.g., 4) bits. The overall programming operation, for example, might include programming U bits in each of V/U target memory cells 120-T in block 600 so that the total number of bits programmed in V/U target memory cells 120-T is V bits, the number of bits to be programmed in target memory cell 420. For an example where four (4) bits (e.g., V=4 bits) are to be programmed in target memory cell 420 and two (2) bits (e.g., U=2 bits) are to be programmed in the target memory cells 120-T, two bits may be programmed in each of the target memory cells 120-T1 and 120-T2 in block 600. For example, target memory cell 420 might be programmed to one of $2^4$=16 levels, where a different threshold voltage range may be assigned to each of the 16 levels. Each of the target memory cells 120-T1 and 120-T2, for example, might be programmed to $2^2$=4 levels, where a different threshold voltage range may be assigned to each of the 4 levels.

A sense amplifier 650 in FIG. 6 and the sense amplifier 150 described above in conjunction with FIG. 2 might include some similar (e.g. some of the same) components that are commonly numbered in FIGS. 2 and 6 and that may be as described above in conjunction with FIG. 2, for example. Note, however, that page buffers 220-1 to 220-4 in FIG. 6 may respectively be page buffers 220-1 to 220-K, e.g., as described above in conjunction with FIGS. 2 and 4, with K=4, for example.

There might be a data register 620, e.g., in sense amplifier 650 and connected to data line 110, in some examples. For example, for the example where U=2 and V=4, two bits of data might be read into data register 620 from target memory cell 120-T1 during a program-verify operation performed on target memory cell 120-T1, and two bits of data might be read into data register 620 from target memory cell 120-T2 during a program-verify operation performed on target memory cell 120-T2.

Following is an example of an overall programming operation for V=4 and U=2 that might be performed to program four bits of data in target memory cell 420. The example may be extended for other values of U and V, where U and V are integers greater than one and V is greater than U.

For example, the overall programming operation might program two of the four bits to be programmed in target memory cell 420 in target memory cell 120-T1 and the remaining two of the four bits to be programmed in target memory cell 420 in target memory cell 120-T2. The two bits programmed into target memory cell 120-T1 may be read into page buffers 220-1 and 220-2 so that combined page buffers 220-1 and 220-2 store the data value read from target memory cell 120-T1, and the two bits programmed into target memory cell 120-T2 may be read into page buffers 220-3 and 220-4 so that combined page buffers 220-3 and 220-4 store the data value read from target memory cell 120-T2. Then, the four bits in page buffers 220-1 to 220-4 may be programmed in target memory cell 420. That is, for example, the data value in combined page buffers 220-1 to 220-4 may be programmed in target memory cell 420.

In some examples, the overall programming operation might program data 1000 in target memory cell 420, where a particular threshold-voltage range is assigned to data 1000. For example, this may be accomplished by programming data 10 of the data 1000 in target memory cell 120-T1 and data 00 of the data 1000 in target memory cell 120-T2, where particular threshold-voltage ranges are respectively assigned to the data 10 and the data 00.

The data 10 may be read from target memory cell 120-T1, and the data 00 may be read from target memory cell 120-T2. In some examples, the 1 of the read data 10 may be stored in page buffer 220-1; the 0 of the read data 10 may be stored in page buffer 220-2; the 0 of the read data 00 may be stored in page buffer 220-3; and the other 0 of the read data 00 may be stored in page buffer 220-4. Note, for example, that the combined page buffers 220-1 and 220-2 may store the data value 10, and the combined page buffers 220-3 and 220-4 may store the data value 00.

Figure 7:
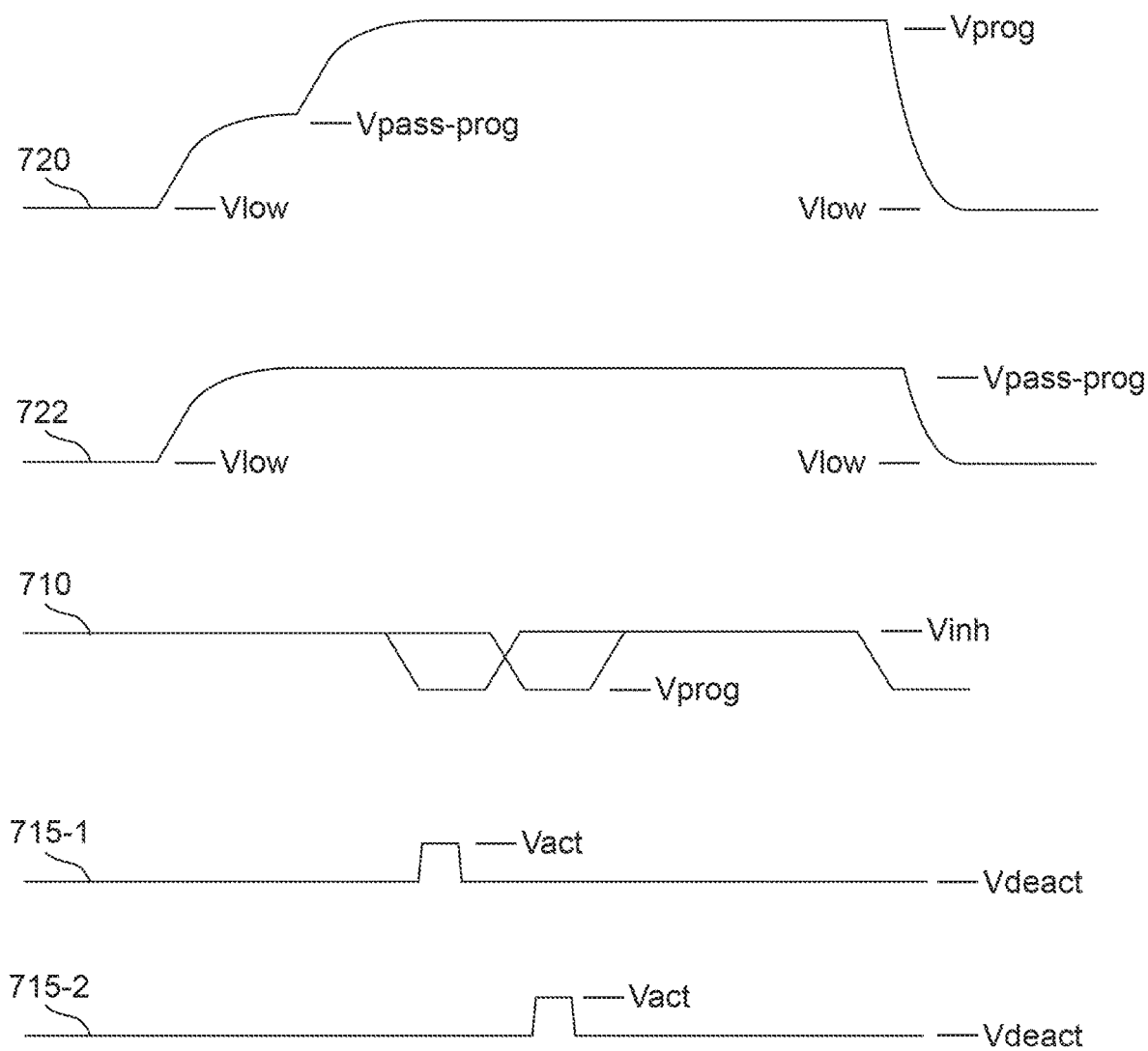
FIG. 7 presents a timing diagram for another example of a programming operation.

FIG. 7 is a timing diagram for an example of a programming operation, e.g., for programming two (e.g., bits 10) of the four bits (e.g., bits 1000) to be programmed in target memory cell 420 in target memory cell 120-T1 and the remaining two bits (e.g., bits 00) of the four bits (e.g., bits 1000) to be programmed in target memory cell 420 in target memory cell 120-T2, e.g., during a two-bit-per-memory-cell mode of operation. That is, for example, memory block 600 may be operating in a two-bit-per-memory-cell mode of operation.

In some examples, select transistors 125-1 to 125-M might be deactivated by a deactivation voltage applied to select line 135 so that strings 118-1 to 118-M might be electrically disconnected from common source 130 throughout the programming operation described in conjunction with FIG. 7. Common source 130 might be grounded during the programming operation, for example.

A voltage 710 may be applied to the data line 110 in FIG. 6. Voltages 715-1 and 715-2 may be respectively applied to select lines 145-1 and 145-2 of the select lines 145-1 to 145-M, and thus respectively to the control gates of select transistors 115-1 and 115-2 that are respectively connected to select lines 145-1 and 145-2, in FIG. 6. A voltage 720 may be applied to selected access line 140-Sel of access lines 140-1 to 140-L, and thus concurrently to the control gates of the target memory cells 120-T1 to 120-TM in FIG. 6 that are connected to selected access line 140-Sel.

A voltage 722 may be applied to unselected access lines (e.g., the remaining access lines other than selected access line 140-Sel) of access lines 140-1 to 140-L. That is, for example, voltage 722 may be applied to the control gates of untargeted memory cells (remaining cells other than target memory cell 120-T1) of the memory cells 120-1 to 120-L in string 118-1 that are respectively connected to unselected access lines of access lines 140-1 to 140-L, to the control gates of untargeted memory cells (remaining cells other than target memory cell 120-T2) of the memory cells 120-1 to 120-L in string 118-2 that are respectively connected to unselected access lines of access lines 140-1 to 140-L, . . . , and to the control gates of untargeted memory cells (remaining cells other than target memory cell 120-TM) of the memory cells 120-1 to 120-L in string 118-M that are respectively connected to unselected access lines of access lines 140-1 to 140-L.

Note, for example, that applying the voltage 722 to a given one of the unselected access lines of access lines 140-1 to 140-L concurrently applies the voltage 722 to the control gates of the memory cells commonly electrically connected to the given one of the unselected access lines of access lines 140-1 to 140-L. For example, applying the voltage 722 to unselected access line 140-1 concurrently applies the voltage 722 to the control gates of the memory cells 120-1 commonly electrically connected to unselected access line 140-1, etc.

The programming operation may commence by respectively loading page buffers 220-1 and 220-2 with respective ones of the two bits (e.g., bits 10) to be programmed in target memory cell 120-T1 and by respectively loading page buffers 220-3 and 220-4 with respective ones of the two bits (e.g., bits 00) to be programmed in target memory cell 120-T2, for example. Note, for example, that the two bits (e.g., bits 10) to be programmed in target memory cell 120-T1 may be two of the four bits (e.g., bits 1000) to be programmed to target memory cell 420 and the two bits (e.g., bits 00) to be programmed in target memory cell 120-T2 may be the other two of the four bits (e.g., bits 1000) to be programmed to target memory cell 420. For example, combined page buffers 220-1 and 220-2 store the data value (e.g., 10) to be programmed in target memory cell 120-T1, and combined page buffers 220-3 and 220-4 store the data value (e.g., 00) to be programmed in target memory cell 120-T2.

The voltage 710 applied to data line 110 may be set at the voltage Vinh, such as a voltage Vcc, that can inhibit the threshold voltages of target memory cells 120-T1 and 120-T2 from being changed when target memory cells 120-T1 and 120-T2 are electrically connected to data line 110. That is, for example, the voltage Vinh on data line 110 inhibits a target memory cell from programming when data line 110 is electrically connected to the string containing that target memory cell, and thus to the channel of that target memory cell.

The voltage 720 applied to selected access line 140-Sel and the voltage 722 applied to the unselected access lines may be increased concurrently to a voltage Vpass-prog from the voltage Vlow, while the voltage 710 applied to data line 110 is at the voltage Vinh. The voltage 720 applied to selected access line 140-Sel may be subsequently increased to a program voltage, such as the voltage Vprog, from the voltage Vpass-prog while the voltage 722 applied to the unselected access lines remains at the voltage Vpass-prog and while the voltage 710 applied to data line 110 is at the voltage Vinh.

The voltage 715-1 applied to select line 145-1 may then be increased from the voltage Vdeact to the voltage Vact to activate select transistor 115-1 to electrically connect data line 110 to string 118-1, and thus to the channel of target memory cell 120-T1, while the voltage 722 applied to the unselected access lines remains at the voltage Vpass-prog and while the voltage 720 applied to selected access line 140-Sel is at the voltage Vprog. This may electrically connect the voltage 710 applied to data line 110, e.g., the voltage Vinh, to string 118-1, and thus to the channel of target memory cell 120-T1, while the voltage 722 applied to the unselected access lines remains at the voltage Vpass-prog and while the voltage 720 applied to selected access line 140-Sel is at the voltage Vprog.

The select transistors of select transistors 115-1 to 115-M other than select transistors 115-1 and 115-2 respectively connected to strings of strings 118-1 to 118-M other than strings 118-1 and 118-2 may remain deactivated during the programming of target memory cells 120-T1 and 120-T2 so that the strings of strings 118-1 to 118-M other than strings 118-1 and 118-2 may be electrically disconnected from data line 110 throughout the programming of target memory cells 120-T1 and 120-T2.

When the threshold voltage of target memory cell 120-T1 might not need to be changed to program the data in combined page buffers 220-1 and 220-2, the voltage 710 applied to data line 110 may remain at the voltage Vinh while select transistor 115-1 is activated. For example, the threshold voltage of target memory cell 120-T1 might not need to be changed when the data in combined page buffers 220-1 and 220-2 corresponds (e.g., is assigned) to an initial state (e.g., to a bit value 11), such as a lowest (e.g., an erased) state of target memory cell 120-T1, e.g., the bit page buffer 220-1 may be 1 and the bit in page buffer 220-2 may be 1. Alternatively, the threshold voltage of target memory cell 120-T1 might not need to be changed when a program-verify operation indicates that the threshold voltage of target memory cell 120-T1 was changed to a threshold voltage in a threshold-voltage range assigned to the data in combined page buffers 220-1 and 220-2 during a previous programming operation, e.g., when target memory cell 120-T1 passes a program-verify operation and the program-verify operation indicates that target memory cell 120-T1 was programmed to the data in combined page buffers 220-1 and 220-2 during the previous programming operation.

When the threshold voltage of target memory cell 120-T1 might need to be changed (e.g., shifted) to program the data in combined page buffers 220-1 and 220-2, the voltage 710 applied to data line 110 might be decreased from the voltage Vinh to the voltage Vdlprog so that the voltage 710 is at the voltage Vdlprog while the voltage 715-1 applied to select line 145-1 is increased to Vact, and thus while select transistor 115-1 is activated. For example, the voltage Vdlprog may allow the threshold voltage of target memory cell 120-T1 to change in response to the voltage 720 applied to selected access line 140-sel, and thus to the control gate of target memory cell 120-T1, being at the voltage Vprog.

Note that the voltage 715-2 applied to select line 145-2 may be at the voltage Vdeact, and thus the select transistor 115-2 connected to select line 145-2 and connected to string 118-2 may be deactivated, while select transistor 115-1 is activated. That is, for example, string 118-2, and thus the channel of target memory cell 120-T2, may be electrically disconnected from data line 110 while string 118-1, and thus the channel of target memory cell 120-T1, is electrically connected to data line 110.

After a certain time, the voltage 715-1 applied to select line 145-1 may be decreased from the voltage Vact to the voltage Vdeact to deactivate select transistor 115-1 and to electrically disconnect data line 110 from string 118-1 while the voltage 722 applied to the unselected access lines remains at the voltage Vpass-prog without first being discharged and while the voltage 720 applied to selected access line 140-Sel remains at the voltage Vprog without first being discharged. After select transistor 115-1 is deactivated, the voltage applied to data line 110 may be either set to the voltage Vinh when the data in combined page buffers 220-3 and 220-4 corresponds to an initial state of target memory cell 120-T2 or set to the voltage Vdlprog when the data in combined page buffers 220-3 and 220-4 indicates that the threshold voltage of target memory cell 120-T2 might need to be changed to program the data in combined page buffers 220-3 and 220-4.

The voltage 715-2 applied to select line 145-2 may then be increased from the voltage Vdeact to the voltage Vact to activate select transistor 115-2 to electrically connect data line 110 to string 118-2, and thus to the channel of target memory cell 120-T2, while the voltage 722 applied to the unselected access lines remains at the voltage Vpass-prog without first being discharged, while the voltage 720 applied to selected access line 140-Sel remains at the voltage Vprog without first being discharged, while the voltage applied to data line 110 may be either set to the voltage Vinh or the voltage Vdlprog, and while the voltage 715-1 applied to select line 145-1 is at the voltage Vdeact, and thus select transistor 115-1 is deactivated. This may electrically connect the voltage 710 applied to data line 110 to string 118-2, and thus to the channel of target memory cell 120-T2, while the voltage 722 applied to the unselected access lines remains at the voltage Vpass-prog and while the voltage 720 applied to selected access line 140-Sel remains at the voltage Vprog.

For example, the select transistor 115-1 may be deactivated, and thus data line 110 may be electrically disconnected from string 118-1, and the select transistor 115-2 may be subsequently activated, and thus data line 110 may be subsequently electrically connected to string 118-2, while continuing to apply the program voltage Vprog to the selected access line 140-Sel without first discharging the program voltage Vprog and while continuing to apply the program-pass voltage Vpass-prog to the unselected access lines without first discharging the program-pass voltage Vpass-prog. After a certain time, the voltage 715-2 applied to select line 145-2 may then be decreased from the voltage Vact to the voltage Vdeact to deactivate select transistor 115-2 and to electrically disconnect data line 110 from string 118-2, and thus from the channel of target memory cell 120-T2.

Figure 8:
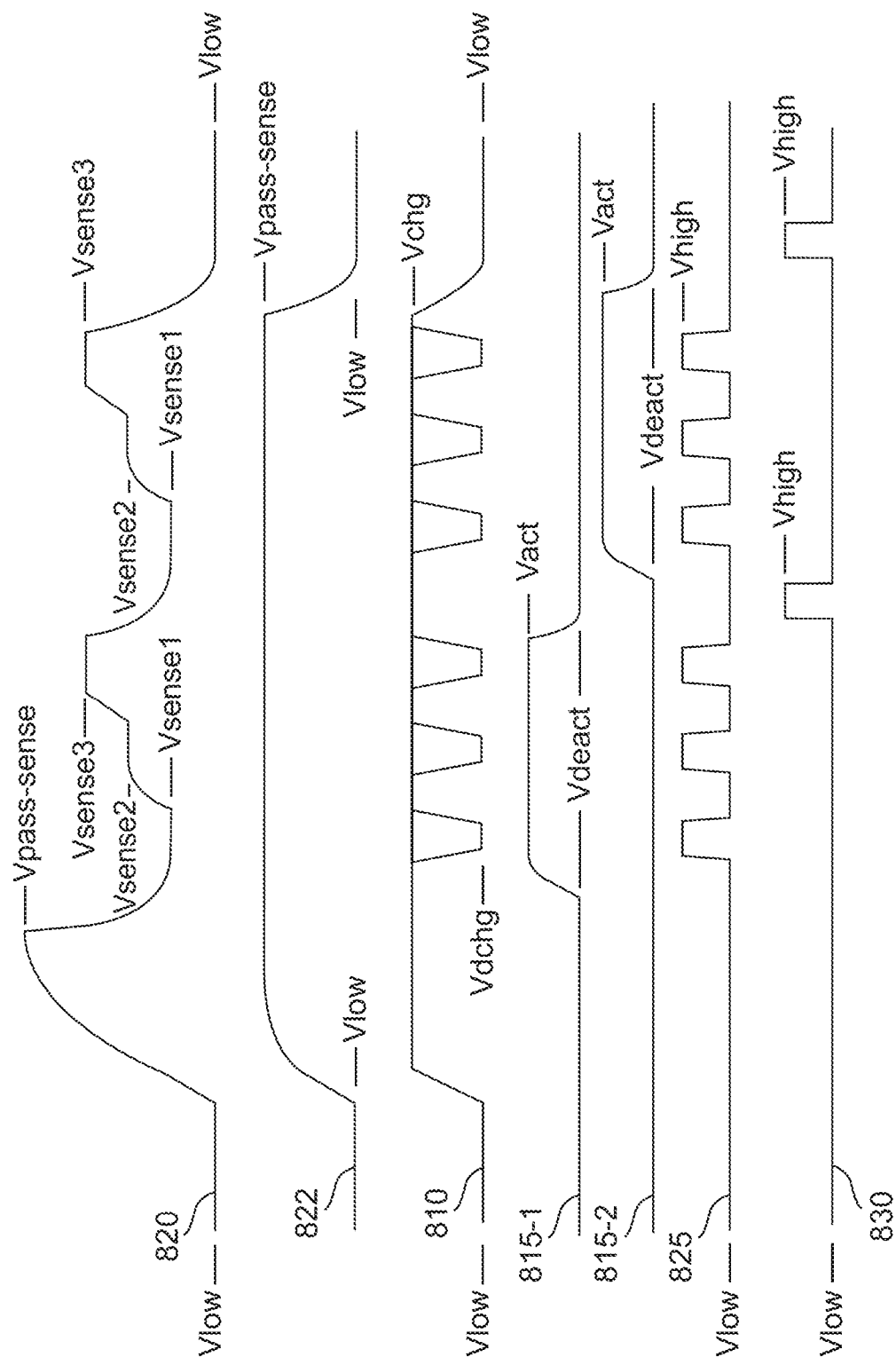
FIG. 8 presents a timing diagram for another example of a sensing operation.

FIG. 8 is a timing diagram of an example of a sensing operation, such as a program-verify operation that might be performed to determine whether target memory cell 120-T1 is programmed to the data in combined page buffers 220-1 and 220-2 and to determine whether target memory cell 120-T2 is programmed to the data in combined page buffers 220-3 and 220-4 or a read operation to read data from target memory cell 120-T1 into page buffers 220-1 and 220-2 and to read data from target memory cell 120-T2 into page buffers 220-3 and 220-4. Note, for example, that the data read from target memory cells 120-T1 and 120-T2 into page buffers 220-1 to 220-4 may then be programmed into target memory cell 420.

The sensing operation might be applied as a program-verify operation after the voltage 720 (FIG. 7) applied to the selected access line 140-Sel is decreased from the voltage Vprog to the voltage Vlow to determine whether the data in combined page buffers 220-1 and 220-2 was programmed in target memory cell 120-T1 and whether the data in combined page buffers 220-3 and 220-4 was programmed in target memory cell 120-T2 in response to the voltage Vprog. If one or both of target memory cells 120-1 and 120-2 is not programmed, the programming operation described above in conjunction with FIG. 7 may be repeated with the voltage Vprog increased to the voltage Vprog plus a step voltage.

A voltage 810 may be applied to data line 110 in FIG. 6. Voltages 815-1 and 815-2 may be respectively applied to select lines 145-1 and 145-2 of the select lines 145-1 to 145-M, and thus respectively to the control gates of select transistors 115-1 and 115-2 that are respectively connected to select lines 145-1 and 145-2, in FIG. 6. A voltage 820 may be applied to the selected access line 140-Sel of access lines 140-1 to 140-L, and thus to the control gates of the target memory cells 120-T1 to 120-TM in FIG. 6 that are connected to the selected access line 140-Sel.

A voltage 822 may be applied to unselected access lines (e.g., the remaining access lines other than selected access line 140-Sel) of access lines 140-1 to 140-L. That is, for example, voltage 822 may be applied to the control gates of untargeted memory cells (remaining cells other than target memory cell 120-T1) of the memory cells 120-1 to 120-L in string 118-1 that are respectively connected to the unselected access lines, to the control gates of untargeted memory cells (remaining cells other than target memory cell 120-T2) of the memory cells 120-1 to 120-L in string 118-2 that are respectively connected to the unselected access lines, . . . , and to the control gates of untargeted memory cells (remaining cells other than target memory cell 120-TM) of the memory cells 120-1 to 120-L in string 118-M that are respectively connected to the unselected access lines. A voltage 825, such as a control voltage, might be applied to the sensing circuitry 210 of sense amplifier 650, and thus to sense amplifier 650.

Throughout the sensing operation, select transistors 125-1 to 125-M might be activated by an activation voltage applied to select line 135 to electrically connect strings 118-1 to 118-M to common source 130. In some examples, common source 130 might be grounded during the sensing operation.

The voltage 810 applied to data line 110 may be increased from the voltage Vlow to the voltage Vchg concurrently with increasing the voltage 820 applied to selected access line 140-Sel from the voltage Vlow to the voltage Vpass-sense and concurrently with increasing the voltage 822 applied to the unselected access lines from the voltage Vlow to the voltage Vpass-sense. That is, for example, the voltages 820 and 822 may be increased from the voltage Vlow to the voltage Vpass-sense concurrently. The voltage 820 may be subsequently decreased to a first sensing voltage Vsense1, such as a first read voltage (e.g., 0.5 volt) or a first program-verify voltage (e.g., 1 volt), from the voltage Vpass-sense while the voltage 822 applied to the unselected access lines remains at the voltage Vpass-sense and while the voltage 810 applied to data line 110 is at the voltage Vchg.

The untargeted memory cells in string 118-1 and the untargeted memory cells in string 118-2 may be activated in response to the voltage Vpass-sense, for example. This means, for example, that since select transistors 125-1 and 125-2 are activated, target memory cells 120-T1 and 120-T2 are electrically connected to source 130. The activated untargeted memory cells in string 118-1 may allow target memory call 120-T1 to be electrically connected to data line 110 when select transistor 115-1 is activated and data line 110 to be electrically connected to source 130 through string 118-1 when select transistor 115-1 and target memory cell 120-T1 are activated. The activated untargeted memory cells in string 118-2 allow target memory cell 120-T2 to be electrically connected to data line 110 when select transistor 115-2 is activated and data line 110 to be electrically connected to source 130 through string 118-2 when select transistor 115-2 and target memory cell 120-T2 are activated.

To sense target memory cell 120-T1, when the voltage 822 reaches the voltage Vsense1, the voltage 815-1 applied to select line 145-1 may be increased from the voltage Vdeact to the voltage Vact to activate select transistor 115-1 to electrically connect data line 110 to string 118-1, and thus to target memory cell 120-T1, while the voltage 822 applied to the unselected access lines remains at the voltage Vpass-sense and while select transistor 115-2 is deactivated, and thus string 118-2 and target memory cell 120-T2 are electrically disconnected from data line 110.

While voltage 820 is at the voltage Vsense1, voltage 822 is at the voltage Vpass-sense, and select transistor 115-1 is activated, the voltage 825 applied to the sensing circuitry 210 might be increased from the voltage Vlow to a voltage Vhigh. The voltage Vhigh may cause (e.g., allow) the sensing circuitry 210 to sense a current and/or voltage on data line 110 while select transistor 115-1 electrically connects string 118-1, and thus target memory cell 120-T1, to data line 110.

When the voltage Vsense1 is insufficient to activate the target memory cell 120-T1, a current might not be able to flow through data line 110 and through the string 118-1 that includes target memory cell 120-T1, for example. As such, for example, sensing circuitry 210 might not sense a current on data line 110, and thus data line 110 may remain at the voltage Vchg. For example, sensing circuitry 210 might sense the voltage Vchg and/or no current on data line 110 when target memory cell 120-T1 remains deactivated while the voltage Vsense1 is applied to selected access line 140-Sel, select transistor 115-1 is activated, select transistor 115-2 is deactivated, the voltage 822 is at the voltage Vpass-sense, and the voltage 825 is at the voltage Vhigh.

When the voltage Vsense1 is sufficient to activate the target memory cell 120-T1, current may flow through data line 110 and through the string 118-1 that includes target memory cell 120-T1, for example. As such, for example, sensing circuitry 210 might sense a current flow on data line 110. The current flow might cause the voltage 810 applied to data line 110 to decrease from the voltage Vchg to the voltage Vdchg while select transistor 115-1 is activated, select transistor 115-2 is deactivated, the voltage 825 is at the voltage Vhigh, the voltage 820 is at the voltage Vsense1, and the voltage 822 is at the voltage Vpass-sense. For example, sensing circuitry 210 might sense the voltage Vdchg and/or a current on data line 110 when target memory cell 120-T1 is activated in response to the voltage Vsense1 being applied to selected access line 140-Sel.

While the voltage 822 remains at Vpass-sense and select transistor 115-1 remains activated, the voltage 825 may be decreased from the voltage Vhigh to the voltage Vlow. The voltage 810 may be left at the voltage Vchg or increased from the voltage Vdchg to the voltage Vchg, depending upon whether or not the voltage 810 discharged in response to the voltage Vsense1, while the voltage 825 is decreased from Vhigh to Vlow. The voltage 820 may be subsequently increased from the voltage Vsense1 to a voltage Vsense2, such as a second read voltage (e.g., 1.5 volts) or a second program-verify voltage (e.g., 2 volts), while the voltage 822 remains at Vpass-sense and select transistor 115-1 remains activated.

While voltage 820 is at the voltage Vsense2, voltage 822 is at the voltage Vpass-sense, and select transistor 115-1 is activated, the voltage 825 applied to the sensing circuitry 210 might be increased from the voltage Vlow to the voltage Vhigh to allow sensing of data line 110 by sensing circuitry 210. Sensing circuitry 210 might sense the voltage Vchg and/or no current on data line 110 when target memory cell 120-T1 remains deactivated in response to the voltage Vsense2 being applied to selected access line 140-Sel, while select transistor 115-1 is activated, select transistor 115-2 is deactivated, the voltage 822 is at the voltage Vpass-sense, and the voltage 825 is at the voltage Vhigh. Sensing circuitry 210 might sense the voltage Vdchg and/or a current on data line 110 when target memory cell 120-T1 is activated in response to the voltage Vsense2 being applied to selected access line 140-Sel, while select transistor 115-1 is activated, select transistor 115-2 is deactivated, the voltage 822 is at the voltage Vpass-sense, and the voltage 825 is at the voltage Vhigh.

While the voltage 822 remains at Vpass-sense and select transistor 115-1 remains activated, the voltage 825 may be decreased from the voltage Vhigh to the voltage Vlow. The voltage 810 may be left at the voltage Vchg or increased from the voltage Vdchg to the voltage Vchg, depending upon whether or not the voltage 810 discharged in response to the voltage Vsense2, while the voltage 825 is again decreased from Vhigh to Vlow. The voltage 820 may be subsequently increased from the voltage Vsense2 to a voltage Vsense3, such as a third read voltage (e.g., 2.5 volts) or a third program-verify voltage (e.g., 3 volts), while the voltage 822 remains at Vpass-sense and select transistor 115-1 remains activated.

While voltage 820 is at the voltage Vsense3, voltage 822 is at the voltage Vpass-sense, and select transistor 115-1 is activated, the voltage 825 applied to the sensing circuitry 210 might be increased from the voltage Vlow to a voltage Vhigh to allow sensing of data line 110 by sensing circuitry 210. Sensing circuitry 210 might sense the voltage Vchg and/or no current on data line 110 when target memory cell 120-T1 remains deactivated in response to the voltage Vsense3 being applied to selected access line 140-Sel, while select transistor 115-1 is activated, select transistor 115-2 is deactivated, the voltage 822 is at the voltage Vpass-sense, and the voltage 825 is at the voltage Vhigh. Sensing circuitry 210 might sense the voltage Vdchg and/or a current on data line 110 when target memory cell 120-T1 is activated in response to the voltage Vsense3 being applied to selected access line 140-Sel, while select transistor 115-1 is activated, select transistor 115-2 is deactivated, the voltage 822 is at the voltage Vpass-sense, and the voltage 825 is at the voltage Vhigh.

While the voltage 822 remains at Vpass-sense, select transistor 115-1 remains activated, and the voltage 820 is at Vsense3, the voltage 825 may again be decreased from the voltage Vhigh to the voltage Vlow. The voltage 815-1 may then be decreased from Vact to Vdeact to deactivate select transistor 115-1 while the voltage 822 remains at Vpass-sense and the voltage 820 remains at Vsense3.

Application of the increasing sensing voltages Vsense1, Vsense2, and Vsense3, e.g., respectively as the first, second, and third program-verify voltages, during a program-verify operation reads the data programmed in target memory cell 120-T1 into data register 620. After the select transistor 115-1 is deactivated and after the voltage 825 is again decreased from the voltage Vhigh to the voltage Vlow, during the program-verify operation, a compare voltage 830 may be increased from the voltage Vlow to the voltage Vhigh, for example. The data in data register 620 may then be compared to the data in combined page buffers 220-1 and 220-2 in response to increasing voltage 830 to the voltage Vhigh. That is, for example, the data in data register 620 may be compared to the data in combined page buffers 220-1 and 220-2 while voltage 830 is at the voltage Vhigh. For example, it may be determined whether target memory cell 120-T1 is programmed to the data in combined page buffers 220-1 and 220-2 in response to comparing the data in data register 620 to the data in combined page buffers 220-1 and 220-2.

When the data in data register 620 matches the data in combined page buffers 220-1 and 220-2, target memory cell 120-T1 is programmed to the data in combined page buffers 220-1 and 220-2, thus passing the program-verify operation. When the data in data register 620 does not match the data in combined page buffers 220-1 and 220-2, target memory cell 120-T1 is not programmed to the data in combined page buffers 220-1 and 220-2, thus failing the program-verify operation.

Application of the increasing sensing voltages Vsense1, Vsense2, and Vsense3, e.g., respectively as the first, second, and third read voltages, during a read operation reads the data programmed to target memory cell 120-T1 into page buffers 220-1 and 220-2. In some examples, the data read from memory cell 120-T1 may not be stored in data register 620 during the read operation.

When target memory cell 120-T1 is activated, and thus sensing circuitry 210 senses the voltage Vdchg and/or a current, in response to the voltage Vsense1 being applied to selected access line 140-Sel, target memory cell 120-T1 might be programmed to a threshold voltage (e.g., a Vt) corresponding to a first (e.g., a lowest) program level and might store data (e.g., data 11) assigned to the first program level. For a program-verify operation, for example, the data (e.g., data 11) assigned to the first program level may then be stored in data register 620. For a read operation, for example, the data (e.g., data 11) assigned to the first program level may then be stored in combined page buffers 220-1 and 220-2, e.g., a 1 in page buffer 220-1 and a 1 in page buffer 220-2.

When target memory cell 120-T1 is not activated, and thus sensing circuitry 210 senses the voltage Vchg and/or no current, in response to the voltage Vsense1 being applied to selected access line 140-Sel and when target memory cell 120-T1 is activated, and thus sensing circuitry 210 senses the voltage Vdchg and/or a current, in response to the voltage Vsense2 being applied to selected access line 140-Sel, target memory cell 120-T1 might be programmed to a Vt corresponding to a second program level and might store data (e.g., data 01) assigned to the second program level. For a program-verify operation, for example, the data (e.g., data 01) assigned to the second program level may then be stored in data register 620. For a read operation, for example, the data (e.g., data 01) assigned to the second program level may then be stored in combined page buffers 220-1 and 220-2, e.g., a 0 in page buffer 220-1 and a 1 in page buffer 220-2.

When target memory cell 120-T1 is not activated, and thus sensing circuitry 210 senses the voltage Vchg and/or no current, in response to the voltage Vsense2 being applied to selected access line 140-Sel and when target memory cell 120-T1 is activated, and thus sensing circuitry 210 senses the voltage Vdchg and/or a current, in response to the voltage Vsense3 being applied to selected access line 140-Sel, target memory cell 120-T1 might be programmed to a Vt corresponding to a third program level that is higher than the second program level and might store data (e.g., data 00) assigned to the third program level. For a program-verify operation, for example, the data (e.g., data 00) assigned to the third program level may then be stored in data register 620. For a read operation, for example, the data (e.g., data 00) assigned to the third program level may then be stored in combined page buffers 220-1 and 220-2, e.g., a 0 in page buffer 220-1 and a 0 in page buffer 220-2.

When target memory cell 120-T1 is not activated, and thus sensing circuitry 210 senses the voltage Vchg and/or no current, in response to the voltage Vsense3 being applied to selected access line 140-Sel, target memory cell 120-T1 might be programmed to a Vt corresponding to a fourth program level higher than the third program level and might store data (e.g., data 10) assigned to the fourth program level. For a program-verify operation, for example, the data (e.g., data 10) assigned to the fourth program level may then be stored in data register 620. For a read operation, for example, the data (e.g., data 10) assigned to the fourth program level may then be stored in combined page buffers 220-1 and 220-2, e.g., a 1 in page buffer 220-1 and a 0 in page buffer 220-2.

Note that for the example where the data 10 is in combined page buffers 220-1 and 220-2, e.g., with 1 in page buffer 220-1 and 0 in page buffer 220-2, the program-verify operation for target memory cell 120-T1 fails when data 11, 01, or 00 are stored in data register 620 and programming of target memory cell 120-T1 will be continued until data 10 is stored in data register 620.

Target memory cell 120-T2 may be sensed after select transistor 115-1 is deactivated, by activating select transistor 115-2 by increasing the voltage 815-2 applied to select line 145-2 from the voltage Vdeact to the voltage Vact while the voltage 822 remains at the voltage Vpass-sense without first being decreased. While the voltage 822 remains at the voltage Vpass-sense without first being decreased, the voltage 820 may also be decreased from the voltage Vsense3 to the voltage Vsense1, e.g., while the voltage 815-1 applied to select line 145-1 is decreased from the voltage Vact to the voltage Vdeact and while the voltage 815-2 is subsequently increased from the voltage Vdeact to the voltage Vact, so that the select transistor 115-2 is activated while the voltage 820 is at the voltage Vsense1.

Note, for example, that the voltage 820 might not be decreased below the lowest sense voltage Vsense1 being applied during the sensing operation in FIG. 8. That is, select transistor 115-1 may be deactivated, and thus string 118-1 and target memory cell 120-T1 may be electrically disconnected from data line 110, and select transistor 115-2 may be activated, and thus string 118-2 and target memory cell 120-T2 may be electrically connected to data line 110 without the voltage 820 being decreased to a voltage that is less than a sensing voltage being applied to target memory cell 120-T1 and/or target memory cell 120-T2.

While voltage 820 is at the voltage Vsense1, voltage 822 is at the voltage Vpass-sense, and select transistor 115-2 is activated, the voltage 825 applied to the sensing circuitry 210 might be increased from the voltage Vlow to the voltage Vhigh to allow sensing of data line 110 by sensing circuitry 210. Sensing circuitry 210 might sense the voltage Vchg and/or no current on data line 110 when target memory cell 120-T2 remains deactivated in response to the voltage Vsense1 being applied to selected access line 140-Sel, while select transistor 115-2 is activated, select transistor 115-1 is deactivated, the voltage 822 is at the voltage Vpass-sense, and the voltage 825 is at the voltage Vhigh. Sensing circuitry 210 might sense the voltage Vdchg and/or a current on data line 110 when target memory cell 120-T2 is activated in response to the voltage Vsense1 being applied to selected access line 140-Sel, while select transistor 115-2 is activated, select transistor 115-1 is deactivated, the voltage 822 is at the voltage Vpass-sense, and the voltage 825 is at the voltage Vhigh.

While the voltage 822 remains at Vpass-sense and select transistor 115-2 remains activated, the voltage 825 may be decreased from the voltage Vhigh to the voltage Vlow. The voltage 810 may be left at the voltage Vchg or increased from the voltage Vdchg to the voltage Vchg, depending upon whether or not the voltage 810 discharged in response to the voltage Vsense1, while the voltage 825 is decreased from Vhigh to Vlow. The voltage 820 may be subsequently increased from the voltage Vsense1 to the voltage Vsense2, while the voltage 822 remains at Vpass-sense and select transistor 115-2 remains activated.

While voltage 820 is at the voltage Vsense2, voltage 822 is at the voltage Vpass-sense, and select transistor 115-2 is activated, the voltage 825 applied to the sensing circuitry 210 might be increased from the voltage Vlow to a voltage Vhigh to allow sensing of data line 110 by sensing circuitry 210. Sensing circuitry 210 might sense the voltage Vchg and/or no current on data line 110 when target memory cell 120-T2 remains deactivated in response to the voltage Vsense2 being applied to selected access line 140-Sel, while select transistor 115-2 is activated, select transistor 115-1 is deactivated, the voltage 822 is at the voltage Vpass-sense, and the voltage 825 is at the voltage Vhigh. Sensing circuitry 210 might sense the voltage Vdchg and/or a current on data line 110 when target memory cell 120-T2 is activated in response to the voltage Vsense2 being applied to selected access line 140-Sel, while select transistor 115-2 is activated, select transistor 115-1 is deactivated, the voltage 822 is at the voltage Vpass-sense, and the voltage 825 is at the voltage Vhigh.

While the voltage 822 remains at Vpass-sense and select transistor 115-2 remains activated, the voltage 825 may be decreased from the voltage Vhigh to the voltage Vlow. The voltage 810 may be left at the voltage Vchg or increased from the voltage Vdchg to the voltage Vchg, depending upon whether or not the voltage 810 discharged in response to the voltage Vsense2, while the voltage 825 is decreased from Vhigh to Vlow. The voltage 820 may be subsequently increased from the voltage Vsense2 to the voltage Vsense3, while the voltage 822 remains at Vpass-sense and select transistor 115-2 remains activated.

While voltage 820 is at the voltage Vsense3, voltage 822 is at the voltage Vpass-sense, and select transistor 115-2 is activated, the voltage 825 applied to the sensing circuitry 210 might be increased from the voltage Vlow to a voltage Vhigh to allow sensing of data line 110 by sensing circuitry 210. Sensing circuitry 210 might sense the voltage Vchg and/or no current on data line 110 when target memory cell 120-T2 remains deactivated in response to the voltage Vsense3 being applied to selected access line 140-Sel, while select transistor 115-2 is activated, select transistor 115-1 is deactivated, the voltage 822 is at the voltage Vpass-sense, and the voltage 825 is at the voltage Vhigh. Sensing circuitry 210 might sense the voltage Vdchg and/or a current on data line 110 when target memory cell 120-T2 is activated in response to the voltage Vsense3 being applied to selected access line 140-Sel, while select transistor 115-2 is activated, select transistor 115-1 is deactivated, the voltage 822 is at the voltage Vpass-sense, and the voltage 825 is at the voltage Vhigh.

Application of the increasing voltages Vsense1, Vsense2, and Vsense3, e.g., respectively as the first, second, and third program-verify voltages, during a program-verify operation reads the data programmed in target memory cell 120-T2 into data register 620. After the select transistor 115-2 is deactivated and after the voltage 825 is again decreased from the voltage Vhigh to the voltage Vlow, during the program-verify operation, the compare voltage 830 may be increased from the voltage Vlow to the voltage Vhigh, for example. The data in data register 620 may then be compared to the data in combined page buffers 220-3 and 220-4 in response to increasing voltage 830 to the voltage Vhigh. That is, for example, the data in data register 620 may be compared to the data in combined page buffers 220-3 and 220-4 while voltage 830 is at the voltage Vhigh. For example, it may be determined whether target memory cell 120-T2 is programmed to the data in combined page buffers 220-3 and 220-4 in response to comparing the data in data register 620 to the data in combined page buffers 220-3 and 220-4.

When the data in data register 620 matches the data in combined page buffers 220-3 and 220-4, target memory cell 120-T2 is programmed to the data in combined page buffers 220-3 and 220-4, thus passing the program-verify operation. When the data in data register 620 does not match the data in combined page buffers 220-3 and 220-4, target memory cell 120-T2 is not programmed to the data in combined page buffers 220-3 and 220-4, thus failing the program-verify operation.

Application of the increasing voltages Vsense1, Vsense2, and Vsense3, e.g., respectively as the first, second, and third read voltages, during a read operation reads the data programmed in target memory cell 120-T2 into page buffers 220-3 and 220-4. In some examples, the data read from memory cell 120-T2 may not be stored in data register 620 during the read operation.

When target memory cell 120-T2 is activated, and thus sensing circuitry 210 senses the voltage Vdchg and/or a current, in response to the voltage Vsense1 being applied to selected access line 140-Sel, target memory cell 120-T2 might be programmed to a Vt corresponding to the first program level and might store the data (e.g., data 11) assigned to the first program level. For a program-verify operation, for example, the data (e.g., data 11) assigned to the first program level may then be stored in data register 620. For a read operation, for example, the data (e.g., data 11) assigned to the first program level may then be stored in combined page buffers 220-3 and 220-4, e.g., a 1 in page buffer 220-3 and a 1 in page buffer 220-4.

When target memory cell 120-T2 is not activated, and thus sensing circuitry 210 senses the voltage Vchg and/or no current, in response to the voltage Vsense1 being applied to selected access line 140-Sel and when target memory cell 120-T2 is activated, and thus sensing circuitry 210 senses the voltage Vdchg and/or a current, in response to the voltage Vsense2 being applied to selected access line 140-Sel, target memory cell 120-T2 might be programmed to a Vt corresponding to the second program level and might store the data (e.g., data 01) assigned to the second program level. For a program-verify operation, for example, the data (e.g., data 01) assigned to the second program level may then be stored in data register 620. For a read operation, for example, the data (e.g., data 01) assigned to the second program level may then be stored in page buffers 220-3 and 220-4, e.g., a 0 in page buffer 220-3 and a 1 in page buffer 220-4.

When target memory cell 120-T2 is not activated, and thus sensing circuitry 210 senses the voltage Vchg and/or no current, in response to the voltage Vsense2 being applied to selected access line 140-Sel and when target memory cell 120-T2 is activated, and thus sensing circuitry 210 senses the voltage Vdchg and/or a current, in response to the voltage Vsense3 being applied to selected access line 140-Sel, target memory cell 120-T2 might be programmed to a Vt corresponding to the third program level and might store the data (e.g., data 00) assigned to the third program level. For a program-verify operation, for example, the data (e.g., data 00) assigned to the third program level may then be stored in data register 620. For a read operation, for example, the data (e.g., data 00) assigned to the third program level may then be stored in page buffers 220-3 and 220-4, e.g., a 0 in page buffer 220-3 and a 0 in page buffer 220-4.

When target memory cell 120-T2 is not activated, and thus sensing circuitry 210 senses the voltage Vchg and/or no current, in response to the voltage Vsense3 being applied to selected access line 140-Sel, target memory cell 120-T2 might be programmed to a Vt corresponding to the fourth program level and might store the data (e.g., data 10) assigned to the fourth program level. For a program-verify operation, for example, the data (e.g., data 10) assigned to the fourth program level may then be stored in data register 620. For a read operation, for example, the data (e.g., data 10) assigned to the fourth program level may then be stored in page buffers 220-3 and 220-4, e.g., a 1 in page buffer 220-3 and a 0 in page buffer 220-4.

Note that for the example where the data 00 is in combined page buffers 220-3 and 220-4, e.g., with 0 in page buffer 220-3 and 0 in page buffer 220-4, the program-verify operation for target memory cell 120-T2 fails when data 11 or 01 are stored in data register 620, and programming of target memory cell 120-T2 will be continued until data 00 is stored in data register 620. In some examples, if the program-verify fails for one of target memory cells 120-T1 and 120-T2 and passes for the other, then programming will continued for the target memory cell for which the program-verify failed.

After target memory cells 120-T1 and 120-T2 are programmed, e.g., respectively to data 10 and 00, and the programmed data is read to page buffers 220-1 to 220-4, e.g., data 10 to combined page buffers 220-1 and 220-2 (e.g., the 1 in page buffer 220-1, the 0 in page buffer 220-2) and data 00 to combined page buffers 220-3 and 220-4 (e.g., one 0 in page buffer 220-3, one 0 in page buffer 220-4), the data (e.g., data 1000) in combined page buffers 220-1 to 220-4 may be programmed in target memory cell 420. That is, for example, the Vt of target memory cell 420 may be programmed to the Vt range, and thus the program level, assigned to the data (e.g., data 1000) in combined page buffers 220-1 to 220-4.

FIG. 9 is a simplified block diagram of an electronic device, e.g., an integrated circuit device, such as a memory device 900, in communication with a controller 930, such as a memory controller, e.g. a host controller, as part of an electronic system, according to an embodiment. Memory device 900 might be a NAND flash memory device, for example.

Controller 930 might include a processor, for example. Controller 930 might be connected to a host, for example, and may receive command signals (or commands), address signals (or addresses), and data signals (or data) from the host and may output data to the host.

Memory device 900 includes an array of memory cells 904 that might include memory block 100 in FIGS. 1 and 2, memory block 400, a portion of which is shown in FIGS. 4 and 6, and/or memory block 600, a portion of which is shown in FIG. 6. A row decoder 908 and a column decoder 910 might be provided to decode address signals. Address signals are received and decoded to access memory array 904.

Memory device 900 might also include input/output (I/O) control circuitry 912 to manage input of commands, addresses, and data to the memory device 900 as well as the output of data and status information from the memory device 900. An address register 914 is in communication with I/O control circuitry 912, and row decoder 908 and column decoder 910, to latch the address signals prior to decoding. A command register 924 is in communication with I/O control circuitry 912 and control logic 916, to latch incoming commands. Control logic 916 may control access to the memory array 904 in response to the commands and generates status information for the external controller 930. The control logic 916 is in communication with row decoder 908 and column decoder 910 to control the row decoder 908 and column decoder 910 in response to the addresses.

Control logic 916 can be included in controller 930. Controller 930 can include, other circuitry, firmware, software, or the like, whether alone or in combination. Controller 930 can be an external controller (e.g., in a separate die from the memory array 904, whether wholly or in part) or an internal controller (e.g., included in a same die as the memory array 904). For example, an internal controller might be a state machine or a memory sequencer.

Controller 930, for example, might be configured to cause the memory device 900 to perform the methods disclosed herein, such as the programming methods discussed above in conjunction with FIGS. 3 and 7 and the sensing methods described above in conjunction with FIGS. 5 and 8.

In some examples, controller 930 may be configured to cause memory device 900 to apply a program voltage to a selected access line commonly connected to a first memory cell of a first string of series-connected memory cells and to a second memory cell of a second string of series-connected memory cells while a data line is electrically connected to the first memory cell and while the data line is electrically disconnected from the second memory cell. Controller 900 may be configured to cause memory device 900, while memory device 900 continues to apply the program voltage to the selected access line, to electrically disconnect the data line from the first memory cell and subsequently electrically connect the data line to the second memory cell.

In some examples, controller 930 might be configured to cause the memory device 900 perform a programming method, including applying a voltage to a selected access line commonly connected to a plurality of memory cells, where respective ones of the plurality of memory cells are respectively in respective ones of a plurality of strings of series-connected memory cells, and while the voltage applied to the selected access line remains at a program voltage without being discharged, electrically connecting a subset of the plurality of memory cells to one data line so that only one memory cell of the subset of the plurality of memory cells is electrically connected to the one data line at a time.

In some examples, controller 930 might be configured to cause the memory device 900 perform a programming method, including programming first data to a first memory cell and second data to a second memory cell, where the first and second memory cells are commonly connected to a first access line; reading the first data from the first memory cell by applying a read voltage to the first access line while the first memory cell is electrically connected to a data line and while the second memory cell is electrically disconnected from the data line; reading the second data from the second memory cell by electrically disconnecting the first memory cell from the data line and electrically connecting the second memory cell to the data line while read voltage remains applied to the first access line, and programming the read first data and the read second data to a single memory cell connected to a second access line.

Control logic 916 is also in communication with a cache register 918 that might include data latches. Cache register 918 latches data, either incoming or outgoing, as directed by control logic 916 to temporarily store data while the memory array 904 is busy writing or reading, respectively, other data. During a write operation, data is passed from the cache register 918 to data register 920 for transfer to the memory array 904; then new data is latched in the cache register 918 from the I/O control circuitry 912. For example, data register 920 might include a sense amplifier, such as sense amplifier 150 or 650, that might include data register 620 and the page buffers 220-1 and 220-K. During a read operation, data is passed from the cache register 918 to the I/O control circuitry 912 for output to controller 930 and subsequent output to a host; then new data is passed from the data register 920 to the cache register 918. A status register 922 is in communication with I/O control circuitry 912 and control logic 916 to latch the status information for output to the controller 930.

Memory device 900 receives control signals at control logic 916 from controller 930 over a control link 932. The control signals may include at least a chip enable CE#, a command latch enable CLE, an address latch enable ALE, and a write enable WE#. Memory device 900 receives command signals (which represent commands), address signals (which represent addresses), and data signals (which represent data) from controller 930 over a multiplexed input/output (I/O) bus 934, e.g., that might include the input/output bus 225 in FIGS. 2, 4, and 6, and outputs data to controller 930 over I/O bus 934.

For example, the commands are received over input/output (I/O) pins [7:0] of I/O bus 934 at I/O control circuitry 912 and are written into command register 924. The addresses are received over input/output (I/O) pins [7:0] of bus 934 at I/O control circuitry 912 and are written into address register 914. The data are received over input/output (I/O) pins [7:0] for an 8-bit device or input/output (I/O) pins [15:0] for a 16-bit device at I/O control circuitry 912 and are written into cache register 918. The data are subsequently written into data register 920 for programming memory array 904. For another embodiment, cache register 918 may be omitted, and the data are written directly into data register 920. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 900 of FIG. 9 has been simplified. It should be recognized that the functionality of the various block components described with reference to FIG. 9 may not necessarily be segregated to distinct components or component portions of an integrated circuit device. For example, a single component or component portion of an integrated circuit device could be adapted to perform the functionality of more than one block component of FIG. 9. Alternatively, one or more components or component portions of an integrated circuit device could be combined to perform the functionality of a single block component of FIG. 9.

Additionally, while specific I/O pins are described in accordance with popular conventions for receipt and output of the various signals, it is noted that other combinations or numbers of I/O pins may be used in the various embodiments.

CONCLUSION

Although specific examples have been illustrated and described herein, it will be appreciated by those of ordinary skill in the art that any arrangement that is calculated to achieve the same purpose may be substituted for the specific examples shown. Many adaptations of the examples will be apparent to those of ordinary skill in the art. Accordingly, this application is intended to cover any adaptations or variations of the examples.

What is claimed is:

1. A programming method, comprising:
    programming first data in a first memory cell and second data in a second memory cell, wherein the first and second memory cells are commonly electrically connected to a first access line;
    reading the first data from the first memory cell by applying a read voltage to the first access line while the first memory cell is electrically connected to a data line and while the second memory cell is electrically disconnected from the data line;

reading the second data from the second memory cell by electrically disconnecting the first memory cell from the data line and electrically connecting the second memory cell to the data line while the read voltage remains applied to the first access line; and programming the read first data and the read second data in a single memory cell electrically connected to a second access line.

2. The method of claim 1, further comprising:

loading the first data from an input/output bus into a first page buffer electrically connected to the data line and loading the second data from the input/output bus into a second page buffer electrically connected to the data line before programming the first data in the first memory cell and the second data in the second memory cell;

wherein reading the first data from the first memory cell comprises reading the first data into the first page buffer and reading the second data from the second memory cell comprises reading the second data into the second page buffer; and wherein programming the read first data and the read second data in the single memory cell comprises programming the first data read into the first page buffer and the second data read into the second page buffer in the single memory cell.

3. The method of claim 1, further comprising, before reading the first data from the first memory cell and reading the second data from the second memory cell, performing a program-verify operation on the first and second memory cells.

4. The method of claim 3, wherein performing the program-verify operation on the first and second memory cells, comprises:

applying a program-verify voltage to the first access line while the first memory cell is electrically connected to the data line and while the second memory cell is electrically disconnected from the data line; and electrically disconnecting the first memory cell from the data line and electrically connecting the second memory cell to the data line while the program-verify voltage remains applied to the first access line.

5. The method of claim 1, wherein programming the first data in the first memory cell comprises programming the first data in a memory cell of a first string of series-connected memory cells of a plurality of strings of series-connected memory cells selectively electrically connected to the data line, and wherein programming the second data in the second memory cell comprises programming the second data in a memory cell of a second string of series-connected memory cells of the plurality of strings of series-connected memory cells selectively electrically connected to the data line.

6. The method of claim 1, further comprising:

programming third data in a third memory cell, wherein the first, second and third memory cells are commonly electrically connected to the first access line;

reading the third data from the third memory cell by electrically disconnecting the second memory cell from the data line and electrically connecting the third memory cell to the data line while the read voltage remains applied to the first access line and while the first memory cell remains electrically disconnected from the data line; and programming the read first data, the read second data and the read third data in the single memory cell electrically connected to the second access line.

7. A programming method, comprising:

for each memory cell of a plurality of memory cells commonly electrically connected to a first access line, with each memory cell of the plurality of memory cells corresponding to respective data, programming the respective data for that memory cell in that memory cell;

for a first memory cell of the plurality of memory cells, reading the respective data from that memory cell by applying a read voltage to the first access line while the first memory cell is electrically connected to a data line and while each remaining memory cell of the plurality of memory cells is electrically disconnected from the data line;

for each remaining memory cell of the plurality of memory cells, reading the respective data from that memory cell by electrically disconnecting a prior read memory cell of the plurality of memory cells from the data line and electrically connecting that memory cell to the data line while the read voltage remains applied to the first access line; and after reading the respective data from each memory cell of the plurality of memory cells, programming the read respective data from each memory cell of the plurality of memory cells in a single memory cell electrically connected to a second access line.

8. The method of claim 7, wherein reading the respective data from any memory cell of the plurality of memory cells occurs while each remaining memory cell of the plurality of memory cells is electrically disconnected from the data line.

9. The method of claim 7, wherein programming the respective data into each memory cell of the plurality of memory cells comprises:

for the first memory cell of the plurality of memory cells, programming the respective data for that memory cell while the first memory cell is electrically connected to the data line and while each remaining memory cell of the plurality of memory cells is electrically disconnected from the data line; and for each remaining memory cell of the plurality of memory cells, programming the respective data for that memory cell by electrically disconnecting a prior programmed memory cell of the plurality of memory cells from the data line and electrically connecting that memory cell to the data line while the programming voltage remains applied to the first access line.

10. The method of claim 9, wherein programming the respective data into each memory cell of the plurality of memory cells further comprises:

operating each memory cell of the plurality of memory cells in a single-bit-per-memory-cell mode of operation while programming; and operating the single memory cell electrically connected to the second access line in a multiple-bit-per-memory-cell mode of operation while programming.

11. The method of claim 7, further comprising:

prior to reading the respective data from each memory cell of the plurality of memory cells, performing a program-verify operating by applying a program-verify voltage to the first access line while sequentially electrically connecting each memory cell of the plurality of memory cells to the data line with each remaining memory cell of the plurality of memory cells is electrically disconnected from the data line.

12. The method of claim 7, further comprising:
for each memory cell of the plurality of memory cells, loading the respective data for that memory cell from an input/output bus into a respective page buffer of a plurality of page buffers electrically connected to the data line before programming the respective data for each memory cell of the plurality of memory cells;
wherein, for each memory cell of the plurality of memory cells, reading the respective data from that memory cell comprises reading the respective data from that memory cell into its respective page buffer; and
wherein programming the read respective data from each memory cell of the plurality of memory cells in the single memory cell comprises programming the respective data read into each respective page buffer of the plurality of page buffers in the single memory cell.

13. The method of claim 7, wherein, for each memory cell of the plurality of memory cells, programming the respective data for that memory cell in that memory cell comprises programming the respective data for that memory cell in a memory cell of a respective string of series-connected memory cells of a plurality of strings of series-connected memory cells, and wherein each string of series-connected memory cells of the plurality of strings of series-connected memory cells is selectively electrically connected to the data line through a respective select gate.

14. The method of claim 13, wherein programming the respective data into each memory cell of the plurality of memory cells comprises:
for the first memory cell of the plurality of memory cells, programming the respective data for that memory cell while its respective select gate receives a first voltage level applied to its control gate and while the respective select gate of each remaining memory cell of the plurality of memory cells receives a second voltage level applied to its control gate, wherein the second voltage level is lower than the first voltage level; and
for each remaining memory cell of the plurality of memory cells, programming the respective data for that memory cell by reducing the voltage level applied to the control gate of the respective select gate of a prior programmed memory cell of the plurality of memory cells from the first voltage level to the second voltage level and increasing the voltage level applied to the control gate of the respective select gate of that memory cell from the second voltage level to the first voltage level while the programming voltage remains applied to the first access line.

15. The method of claim 14, wherein programming the respective data for any memory cell of the plurality of memory cells while its respective select gate receives the first voltage level applied to its control gate and while the respective select gate of each remaining memory cell of the plurality of memory cells receives the second voltage level applied to its control gate, comprises a second voltage level configured to deactivate the respective select gate of each remaining memory cell of the plurality of memory cells regardless of a value of the respective data of each remaining memory cell of the plurality of memory cells.

16. A programming method, comprising:
programming first data in a first memory cell operating in a single-bit-per-memory-cell mode of operation and programming second data in a second memory cell operating in the single-bit-per-memory-cell mode of operation, wherein the first and second memory cells are commonly electrically connected to a first access line;
reading the first data from the first memory cell by applying a read voltage to the first access line while the first memory cell is electrically connected to the data line and while the second memory cell is electrically disconnected from the data line;
reading the second data from the second memory cell by electrically disconnecting the first memory cell from the data line and electrically connecting the second memory cell to the data line while the read voltage remains applied to the first access line; and
programming the read first data and the read second data in a single memory cell electrically connected to a second access line operating in a multiple-bit-per-memory-cell mode of operation.

17. The method of claim 16, further comprising:
programming third data in a third memory cell operating in the single-bit-per-memory-cell mode of operation, wherein the first, second and third memory cells are commonly electrically connected to the first access line;
reading the third data from the third memory cell by electrically disconnecting the second memory cell from the data line and electrically connecting the third memory cell to the data line while the read voltage remains applied to the first access line and while the first memory cell remains electrically disconnected from the data line; and
programming the read first data, the read second data and the read third data in the single memory cell electrically connected to the second access line and operating in the multiple-bit-per-memory-cell mode of operation.

18. The method of claim 16, further comprising:
prior to reading the first data from the first memory cell and reading the second data from the second memory cell, performing a program-verify operation by applying a program-verify voltage to the first access line while the first memory cell is electrically connected to the data line and while the second memory cell is electrically disconnected from the data line, and electrically disconnecting the first memory cell from the data line and electrically connecting the second memory cell to the data line while continuing to apply the program-verify voltage to the first access line.

19. The method of claim 16, wherein programming the first data in the first memory cell comprises programming the first data in a memory cell of a first string of series-connected memory cells of a plurality of strings of series-connected memory cells selectively electrically connected to the data line, and wherein programming the second data in the second memory cell comprises programming the second data in a memory cell of a second string of series-connected memory cells of the plurality of strings of series-connected memory cells selectively electrically connected to the data line through a respective select gate.

20. The method of claim 19, wherein programming the first data in the first memory cell and programming the second data in the second memory cell comprises:
programming the first data in the first memory cell while its respective select gate receives a first voltage level applied to its control gate and while the respective select gate of the second memory cell receives a second voltage level applied to its control gate, wherein the second voltage level is lower than the first voltage level; and
programming the second data in the second memory cell by reducing the voltage level applied to the control gate of the respective select gate of the first memory cell from the first voltage level to the second voltage level and increasing the voltage level applied to the control gate of the respective select gate of the second memory cell from the second voltage level to the first voltage level while the programming voltage remains applied to the first access line.

\* \* \* \* \*